United States Patent
Yoo et al.

(10) Patent No.: US 12,218,113 B2
(45) Date of Patent: Feb. 4, 2025

(54) DISPLAY DEVICE AND METHOD OF MANUFACTURING THE SAME

(71) Applicant: Samsung Display Co., Ltd., Yongin-si (KR)

(72) Inventors: In Kyung Yoo, Hwaseong-si (KR); Hee Na Kim, Hwaseong-si (KR); Chong Sup Chang, Hwaseong-si (KR); Cha Dong Kim, Seoul (KR); Sang Jin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 596 days.

(21) Appl. No.: 17/445,686

(22) Filed: Aug. 23, 2021

(65) Prior Publication Data
US 2022/0077125 A1    Mar. 10, 2022

(30) Foreign Application Priority Data

Sep. 7, 2020 (KR) .................. 10-2020-0113644

(51) Int. Cl.
H01L 25/16 (2023.01)
H01L 33/62 (2010.01)

(52) U.S. Cl.
CPC .......... H01L 25/167 (2013.01); H01L 33/62 (2013.01)

(58) Field of Classification Search
CPC .................................................. H01L 25/167
See application file for complete search history.

(56) References Cited

U.S. PATENT DOCUMENTS

| 12,004,412 | B2 | 6/2024 | Jeong et al. | |
| 2009/0315056 | A1* | 12/2009 | Kim | H01L 33/641 |
| | | | | 257/E33.059 |
| 2018/0175106 | A1* | 6/2018 | Kim | H01L 33/60 |
| 2019/0115513 | A1* | 4/2019 | Im | H05K 1/111 |
| 2019/0244567 | A1* | 8/2019 | Cho | G09G 3/3233 |
| 2019/0244985 | A1* | 8/2019 | Kim | H01L 27/124 |
| 2019/0251898 | A1* | 8/2019 | Cho | H01L 27/156 |
| 2020/0075667 | A1 | 3/2020 | Lee et al. | |
| 2020/0124986 | A1 | 4/2020 | Lee et al. | |
| 2020/0152835 | A1 | 5/2020 | Ko et al. | |

(Continued)

FOREIGN PATENT DOCUMENTS

| EP | 3828927 A1 | 6/2021 |
| EP | 3890013 A1 | 10/2021 |

(Continued)

OTHER PUBLICATIONS

Partial European Search Report dated Feb. 8, 2022, corresponding to European Patent Application No. EP 21195151.2 (11 pages).

*Primary Examiner* — Mounir S Amer
(74) *Attorney, Agent, or Firm* — Lewis Roca Rothgerber Christie LLP

(57) ABSTRACT

A display device includes a substrate, a data conductive layer on the substrate and including a first voltage line, a via layer on the data conductive layer, a light emitting element on the via layer, a first contact electrode on the light emitting element and contacting a first end of the light emitting element, and a second contact electrode on the light emitting element and contacting a second end of the light emitting element, wherein the second contact electrode is electrically connected to the first voltage line through a first contact hole penetrating the via layer.

15 Claims, 20 Drawing Sheets

(56) References Cited

U.S. PATENT DOCUMENTS

| | | |
|---|---|---|
| 2021/0159268 A1 | 5/2021 | Heo et al. |
| 2021/0313498 A1 | 10/2021 | Kim et al. |
| 2021/0318623 A1 | 10/2021 | Lee et al. |
| 2021/0399043 A1 | 12/2021 | Lee et al. |

FOREIGN PATENT DOCUMENTS

| | | |
|---|---|---|
| KR | 10-2016-0002555 A | 1/2016 |
| KR | 10-1713818 B1 | 3/2017 |
| KR | 10-2019-0029831 A | 3/2019 |
| KR | 10-2019-0137742 A | 12/2019 |
| WO | 2020-059994 A1 | 3/2020 |
| WO | 2020-060002 A1 | 3/2020 |
| WO | 2020-111417 A1 | 6/2020 |
| WO | 2020-116732 A1 | 6/2020 |

\* cited by examiner

FIG. 1
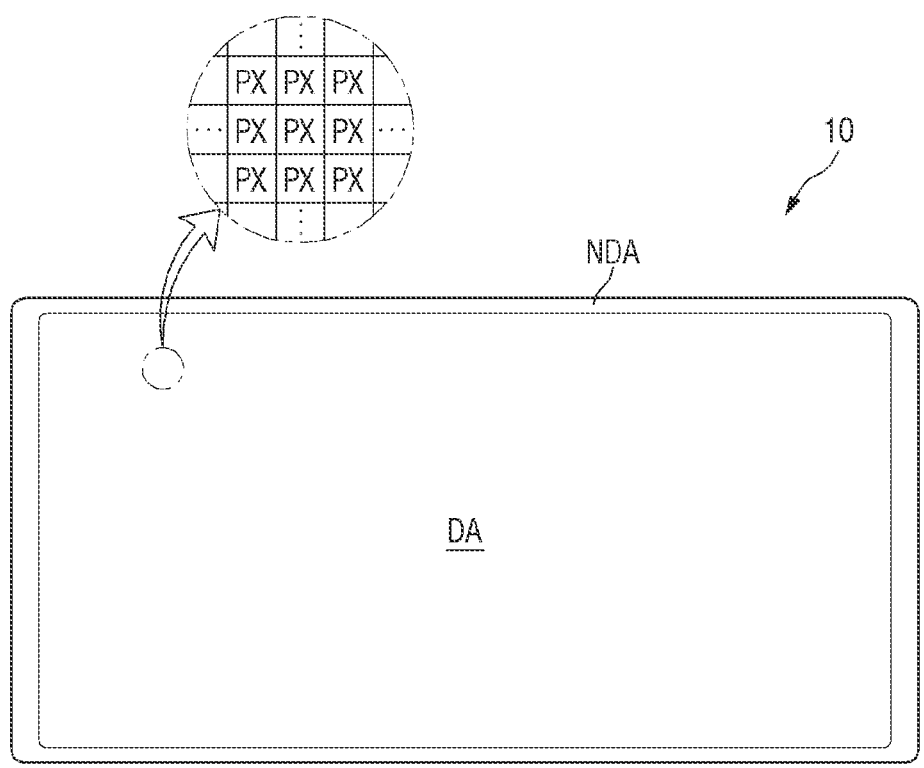
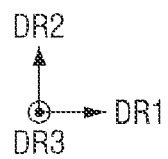

DISPLAY DEVICE AND METHOD OF MANUFACTURING THE SAME

CROSS-REFERENCE TO RELATED APPLICATION

This application claims priority to and the benefit of Korean Patent Application No. 10-2020-0113644, filed on Sep. 7, 2020 in the Korean Intellectual Property Office, the entire content of which is hereby incorporated by reference.

BACKGROUND

1. Field

One or more embodiments of the present disclosure relate to a display device and a method of manufacturing the same.

2. Description of the Related Art

The importance of a display device has increased with the development of multimedia. Accordingly, various types (or kinds) of display devices such as an organic light emitting display (OLED) and/or a liquid crystal display (LCD) have been used.

A display device is a device for displaying an image, and includes a display panel such as a light emitting display panel and/or a liquid crystal display panel. Among them, the light emitting display panel may include a light emitting element such as a light emitting diode (LED). Examples of the light emitting diode (LED) may include an organic light emitting diode (OLED) using an organic material as a fluorescent material and an inorganic light emitting diode using an inorganic material as a fluorescent material.

SUMMARY

One or more aspects of embodiments of the present disclosure are directed toward a display device that does not additionally include an electrode for aligning light emitting elements, and instead operates by applying an electrical signal for aligning light emitting elements using an alignment mask including an external alignment electrode.

One or more aspects of embodiments of the present disclosure are directed toward a method of manufacturing a display device, in which the number of masks is reduced by performing a process of aligning light emitting elements by applying an electrical signal for aligning light emitting elements using an alignment mask including an external alignment electrode.

In one or more embodiments, a display device includes a substrate, a data conductive layer on the substrate and including a first voltage line, a via layer on the data conductive layer, a light emitting element on the via layer, a first contact electrode on the light emitting element and contacting one end of the light emitting element, and a second contact electrode on the light emitting element and contacting the other end of the light emitting element, wherein the second contact electrode is electrically coupled to the first voltage line through a first contact hole penetrating the via layer.

In one or more embodiments, the second contact electrode is in direct contact with the first voltage line.

In one or more embodiments, the display device includes a transistor between the substrate and the data conductive layer, wherein the first contact electrode is electrically coupled to the transistor.

In one or more embodiments, the data conductive layer further includes a first conductive pattern electrically coupled to a first electrode of the transistor, and the first contact electrode is electrically coupled to the first conductive pattern through a second contact hole penetrating the via layer.

In one or more embodiments, the first contact electrode is in direct contact with the first conductive pattern.

In one or more embodiments, the light emitting element is on one surface of the via layer.

In one or more embodiments, the first contact electrode and the second contact electrode are on one surface of the via layer exposed by the light emitting element.

In one or more embodiments, the display device includes a first insulating layer on the light emitting element, wherein the first contact electrode and the second contact electrode are on the first insulating layer.

In one or more embodiments, the data conductive layer further includes an alignment mark.

In one or more embodiments, the display device includes a bank on the via layer, wherein the bank does not overlap the light emitting element in a thickness direction of the substrate, and the first contact electrode and the second contact electrode are on the bank.

In one or more embodiments, the first contact electrode and the second contact electrode are directly on a side surface of the bank.

In one or more embodiments, the via layer includes a first region having a first thickness and a second region having a second thickness greater than the first thickness, and the light emitting element is on the first region of the via layer.

In one or more embodiments, the second region of the via layer does not overlap the light emitting element in a thickness direction of the substrate, and a side surface of the second region of the via layer and one end selected from the first end and the second end of the light emitting element face each other.

In one or more embodiments, the first contact electrode and the second contact electrode are on the second region of the via layer exposed by the light emitting element.

In one or more embodiments, one surface of the via layer includes a groove in which one surface of the via layer is recessed in a thickness direction of the via layer.

In one or more embodiments, the light emitting element is in the groove.

According to one or more embodiments, a method of manufacturing a display device includes spraying an ink onto a target substrate, the ink including a solvent and a light emitting element dispersed in the solvent; and aligning the light emitting element using an alignment mask including a first alignment electrode and a second alignment electrode spaced apart from each other.

In one or more embodiments, the aligning of the light emitting element includes placing the alignment mask on the target substrate; and applying an alignment signal to the first alignment electrode and the second alignment electrode of the alignment mask to form an electric field.

In one or more embodiments, the electric field is formed between the first alignment electrode and the second alignment electrode, and the light emitting element is aligned between the first alignment electrode and the second alignment electrode on the target substrate by the electric field.

In one or more embodiments, the target substrate includes a first substrate, a conductive layer on the first substrate, and a via layer on the conductive layer, and the light emitting element is aligned to be directly on one surface of the via layer.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

The display device according to one or more embodiments does not additionally include an electrode for aligning light emitting elements, but instead operates by applying an electrical signal for aligning light emitting elements using an alignment mask including an external alignment electrode.

In the method of manufacturing a display device according to one or more embodiments, a process of aligning light emitting elements may be performed by applying an electrical signal for aligning light emitting elements using an alignment mask including an external alignment electrode. Therefore, the display device does not additionally include an electrode for aligning light emitting elements, so that the mask process used in the manufacture of the display device is reduced, thereby improving the manufacturing process efficiency of the display device.

Although the embodiments of the present disclosure have been disclosed for illustrative purposes, those skilled in the art will appreciate that various modifications, additions and substitutions are possible, without departing from the scope and spirit of the present disclosure as disclosed in the accompanying claims and their equivalents.

BRIEF DESCRIPTION OF THE DRAWINGS

The above and other aspects and features of the present disclosure will become more apparent by describing in more detail embodiments thereof with reference to the attached drawings, in which:

FIG. 1 is a schematic plan view of a display device according to one or more embodiments;

DETAILED DESCRIPTION

Figure 2:
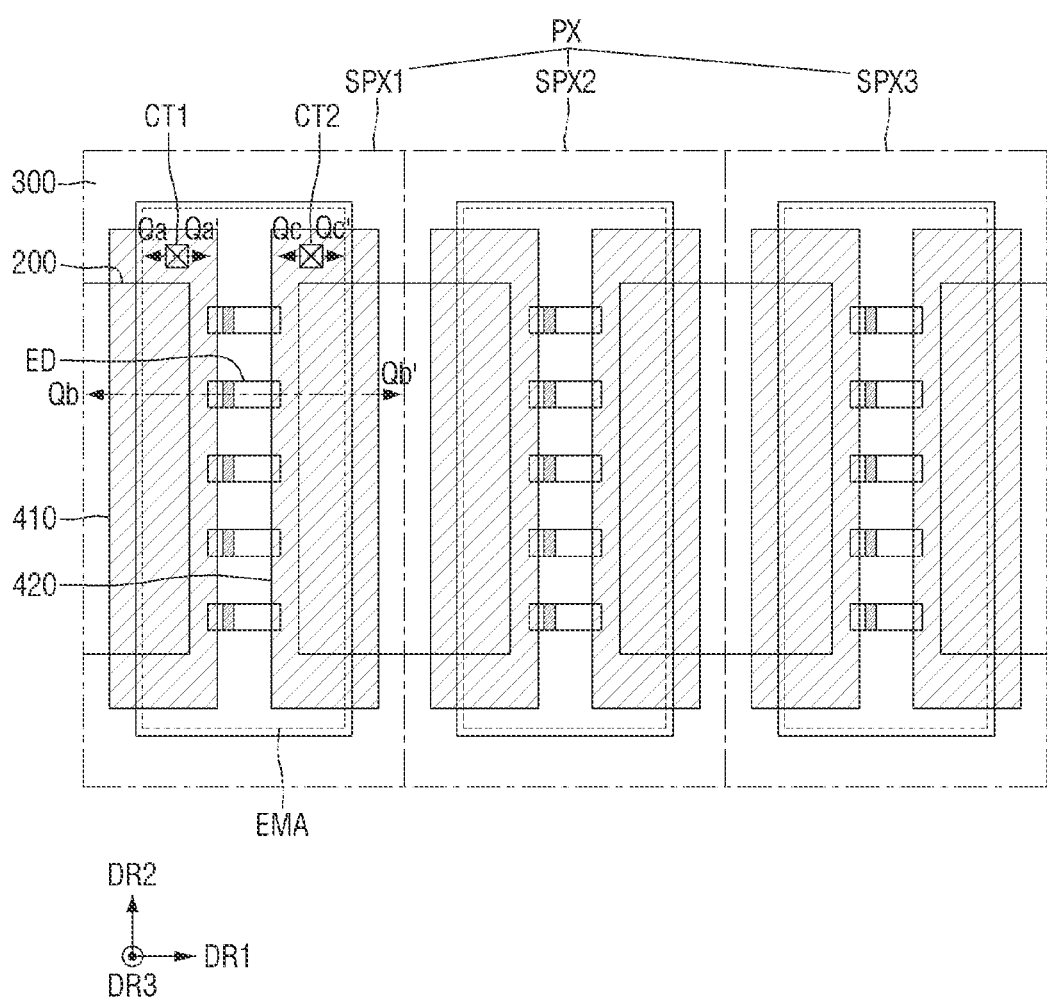
FIG. 2 is a plan view illustrating one pixel of a display device according to one or more embodiments.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will filly convey the scope of the present application to those skilled in the art.

It will also be understood that when a layer is referred to as being "on" another layer or substrate, it can be directly on the other layer or substrate (without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments of the present disclosure will be described with reference to the attached drawings.

FIG. 1 is a schematic plan view of a display device according to one or more embodiments.

Referring to FIG. 1, a display device 10 displays a mobile (e.g., moving) image or a still image. The display device 1 may refer to any suitable electronic device that provides a display screen. Non-limiting examples of the display device 10 may include televisions, notebook computers, monitors, billboards, internet of things (IoTs), mobile phones, smart phones, tablet personal computers (tablet PCs), electronic watches, smart watches, watch phones, mobile communication terminals, electronic notebooks, electronic books, portable multimedia players (PMPs), navigators, game machines, digital cameras, and camcorders.

The display device 10 includes a display panel for providing a display screen. Non-limiting examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel is used as the display panel will be described as an example, but the present disclosure is not limited thereto. Other suitable display panels may be applied as long as the same technical spirit is applicable.

In the drawings, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are located. The third direction DR3 is perpendicular to each of the first direction DR1 and the second direction DR2. In embodiments explaining the display device 10, the third direction DR3 represents a thickness direction of the display device 10.

The display device 10 may have a rectangular shape in which the first direction DR1 is longer than the second direction DR2 in a plan view. In a plan view, the corner of the display device 10 where the long side meets the short side may be right-angled, but is not limited thereto, and may have a rounded curved shape. The shape of the display device 10 is not limited to those exemplified, and may be variously suitably changed. For example, the display device 10 may have a shape such as a square, a rectangle having rounded corners (vertexes), a polygon, or a circle, in a plan view.

The display surface of the display device 10 may be positioned at one side of the third direction DR3, which is a thickness direction. In the description of the display device 10, unless otherwise stated in the embodiments, the term "upper" refers to a display direction toward one side in the third direction DR3, likewise the term "upper surface" refers to a surface facing one side in the third direction DR3. The term "lower" refers to a direction opposite to the display direction toward the other side in the third direction DR3, and the term "lower surface" refers to a surface facing the other side in the third direction DR3. Further, the terms "left", "right", "upper", and "lower" refer to directions when the display panel is viewed on the plane. For example, the term "right" refers to the first direction DR1, the term "left" refers to a direction opposite to the first direction DR1, the term "upper" (in connection with the description of the display panel) refers to the second direction DR2, and the term "lower" (in connection with the description of the display panel) refers to a direction opposite to the second direction DR2.

The display device 10 may include a display area DA and a non-display area NDA. The display area DA is an area where an image is displayed, and the non-display area NDA is an area where an image is not displayed. The display area DA may be referred to as an active area, and the non-display area NDA may be referred to as an inactive area.

The shape of the display area DA may follow the shape of the display device 10. For example, the display area DA may have a planar rectangular shape similar to the overall shape of the display device 10. The display area DA may generally occupy the center of the display device 10.

The display area DA may include a plurality of pixels PX. The plurality of pixels PX may be arranged in a matrix direction (e.g., matrix orientation). The shape of each of the pixels PX may be rectangular or square in a plan view, but is not limited thereto. Each of the pixels PX may also have a rhombus shape, each side thereof being inclined with respect to one direction. The respective pixels PX may be alternately arranged in a stripe pattern or a PenTile®/PENTILE® pattern (PENTILE® is a registered trademark owned by Samsung Display Co., Ltd.).

The non-display area NDA may be around the display area DA. The non-display area NDA may entirely or partially surround the display area DA. In one or more embodiments, the display area DA may have a rectangular shape, and the non-display area NDA may be adjacent to four sides of the display area DA. The non-display area NDA may constitute a bezel of the display device 10. The non-display area NDA may be provided with lines, circuit drivers, and/or a pad unit on which an external device is mounted.

FIG. 2 is a plan view illustrating one pixel of a display device according to one or more embodiments.

Referring to FIG. 2, one pixel PX of the display device 10 may include a plurality of sub-pixels (SPX: SPX1, SPX2, SPX3). For example, the pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. In one or more embodiments, the first color may be blue, the second color may be green, and the third color may be red. However, the present disclosure is not limited thereto, and the first to third sub-pixels SPX1, SPX2, and SPX3 may emit light of the same color. Although it is shown in FIG. 2 that one pixel PX includes three sub-pixels SPX1, SPX2, and SPX3, the present disclosure is not limited thereto, and one pixel PX may include a larger number of sub-pixels SPX.

Each sub-pixel SPX may include a light emission area EMA and a non-light emission area around the light emission area EMA.

The light emission area EMA is an area in which a light emitting element ED is provided to emit light of a specific (or set) wavelength band, and the non-light emission area may be an area in which the light emitting element 300 is not provided, or which the light emitted from the light emitting element ED does not reach and thus no light is emitted.

The light emission area EMA may include an area in which the light emitting element ED is positioned. The light emission area EMA may also include an area in which light emitted from the light emitting element ED is emitted, as an area adjacent to the area in which the light emitting element ED is positioned. The light emission area EMA may also include an area in which light emitted from the light emitting element ED is reflected or refracted by another member and is emitted outward. The plurality of light emitting elements ED are provided in each sub-pixel SPX, and a light emission area EMA including an area in which the plurality of light emitting elements ED are positioned, and an area adjacent thereto, may be formed.

The non-light emission area is in contact with the non-light emission area of adjacent another sub-pixel SPX (regardless of whether the sub-pixel SPX is in the same pixel PX). The non-light emission areas of adjacent sub-pixels SPX may be connected to each other. In one or more embodiments, the non-light emission areas of all the sub-pixels SPX may be connected to at least one other non-light emission area, but the present disclosure is not limited thereto. The light emission area EMA of each of the adjacent sub-pixels SPX may be divided by the non-light emission areas.

Figure 3:
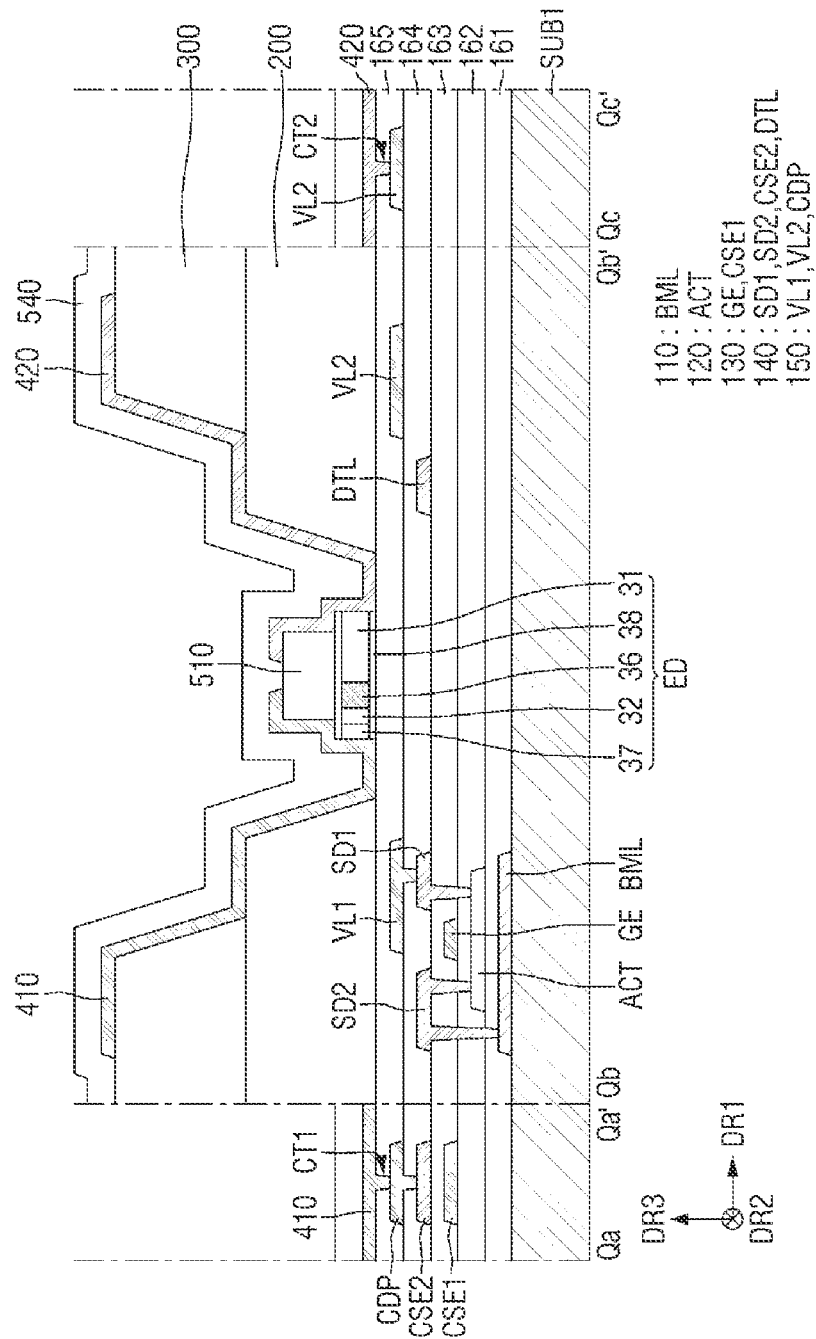
FIG. 3 is a cross-sectional view of a display device, taken along the lines Qa-Qa', Qb-Qb', and Qc-Qc' of FIG. 2.

FIG. 3 is a cross-sectional view taken along the lines Qa-Qa', Qb-Qb', and Qc-Qc' of FIG. 2.

Referring to FIGS. 2 and 3, a display device 10 according to one or more embodiments may include a first substrate SUB1, a circuit element layer on the first substrate SUB1, and a light emitting element layer on the circuit element layer. The circuit element layer includes a lower metal layer 110, a buffer layer 161, a semiconductor layer 120, a plurality of conductive layers 130, 140, 150, a plurality of insulating layers 162, 163, and 164, and a via layer 165, which are arranged on the first substrate SUB1. The light emitting element layer may be on the via layer 165 of the circuit element layer, and may include a first bank 200, a second bank 300, a light emitting element ED, a first contact electrode 410, a second contact electrode 420, and a plurality of insulating layers 510 and 540.

The first substrate SUB1 may be an insulating substrate. The first substrate SUB1 may include a transparent material. For example, the first substrate SUB1 may include an insulating material such as glass, quartz, and/or polymer resin. The first substrate SUB1 may be a rigid substrate, but may also be a flexible substrate capable of bending, folding, rolling, and/or the like.

Hereinafter, a cross-sectional structure of the circuit element layer on the first substrate SUB1 will be described in more detail.

The circuit element layer driving the sub-pixel SPX may be on the first substrate SUB1. The circuit element layer may be between the light emitting element layer and the first substrate SUB1. The circuit element layer includes a lower metal layer 110, a buffer layer 161, a semiconductor layer 120, a gate conductive layer 130, first and second data conductive layers 140 and 150, a plurality of insulating layers 162, 163, and 164, and a via layer 165, which are arranged on the first substrate SUB1.

The lower metal layer 110 may be on the first substrate SUB1. The lower metal layer 110 may include a light blocking layer BML. The light blocking layer BML may serve to protect a semiconductor pattern ACT of the semiconductor layer 120 from external light. The light blocking layer BML may include a light blocking material. For example, the light blocking layer BML may be formed of an opaque metal material that blocks or substantially reduces light transmission.

The light blocking layer BML has a patterned shape. The light blocking layer BML may cover at least a channel region of the semiconductor pattern ACT of a transistor of the display device 10 under the light blocking layer BML, and may cover the entire semiconductor pattern ACT of the transistor. However, the present disclosure is not limited thereto, and the light blocking layer BLM may be omitted.

The buffer layer 161 may be on the lower metal layer 110. The buffer layer 161 may cover the entire surface of the first substrate SUB1 on which the lower metal layer 110 is positioned. The buffer layer 161 may serve to protect a transistor from moisture penetrating through the first substrate SUB1 that is vulnerable to moisture permeation. The buffer layer 161 may be formed of a plurality of inorganic layers alternately stacked. For example, the buffer layer 161 may be formed as multilayers in which inorganic layers including at least one of silicon oxide (SiOx), silicon nitride (SiNx), or silicon oxynitride (SiOxNy) are alternately stacked.

The semiconductor layer 120 may be on the buffer layer 161. The semiconductor layer 120 may include a semiconductor pattern ACT of a transistor. The semiconductor pattern ACT may overlap the light blocking layer BML.

The semiconductor layer 120 may include polycrystalline silicon, an oxide semiconductor, and/or the like. In one or more embodiments, when the semiconductor layer 120 includes polycrystalline silicon, the semiconductor layer 120 may be formed by crystallizing amorphous silicon. In another embodiment, the semiconductor layer 120 may include an oxide semiconductor. Non-limiting examples of the oxide semiconductor may include indium-tin oxide (ITO), indium-zinc oxide (IZO), indium-gallium oxide (IGO), indium-Indium-zinc-tin oxide (IZTO), indium-gallium-zinc oxide (IGZO), indium-gallium-tin oxide (IGTO), and indium-gallium-zinc-tin oxide (IGZTO).

The gate insulating layer 162 may be on the semiconductor layer 120. The gate insulating layer 162 may be on the buffer layer 161 on which the semiconductor pattern ACT is positioned. The gate insulating layer 162 may function as a gate insulating layer of a transistor. The gate insulating layer 162 may be formed of an inorganic layer including an inorganic material such as silicon oxide (SiOx), silicon nitride (SiNx), and/or silicon oxynitride (SiOxNy), or may be formed in a stacked structure thereof.

The gate conductive layer 130 may be on the gate insulating layer 162. The gate conductive layer 130 may include a gate electrode GE of a transistor and a first capacitor electrode CSE1 of a storage capacitor.

The gate electrode GE may overlap the channel region of the semiconductor pattern ACT of the transistor in the third direction DR3. The first capacitor electrode CSE1 may overlap a second capacitor electrode CSE2, which will be described hereinbelow, in the third direction DR3. The first capacitor electrode CSE1 may overlap the second capacitor electrode CSE2 in the third direction DR3 to form a storage capacitor therebetween. In some embodiments, the first capacitor electrode CSE1 and the gate electrode GE may be integrally formed. A part of the integrated layer may include the gate electrode GE, and the other part thereof may include the first capacitor electrode CSE1.

The gate conductive layer 130 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The interlayer insulating layer 163 is on the gate conductive layer 130. The interlayer insulating layer 163 may be on the gate insulating layer 162 on which the gate conductive layer 130 is formed. The interlayer insulating layer 163 may include an inorganic insulating material such as silicon oxide (SiOx), silicon nitride (SINx), and/or silicon oxynitride (SiOxNy).

The first data conductive layer 140 is on the interlayer insulating layer 163. The first data conductive layer 140 may include a first source/drain electrode SD1 and a second source/drain electrode SD2 of a transistor, a second capacitor electrode CSE2 of a storage capacitor, and a data line DTL.

The first and second source/drain electrodes SD1 and SD2 may be electrically connected to both end regions of the semiconductor pattern ACT of the transistor (for example, the doping regions of the semiconductor pattern ACT of the transistor) through a contact hole penetrating the interlayer insulating layer 163 and the gate insulating layer 162. Further, the second source/drain electrode SD2 of the transistor may be electrically connected to the light blocking layer BML through a contact hole penetrating the interlayer insulating layer 163, the gate insulating layer 162, and the buffer layer 161.

The data line DTL may apply a data signal to another transistor included in the display device 10. In one or more embodiments, the data line DTL may be connected to a source/drain electrode of another transistor.

The second capacitor electrode CSE2 may be on the interlayer insulating layer 163 to overlap the first capacitor electrode CSE1 in the third direction DR3. As described above, the second capacitor electrode CSE2 may overlap the first capacitor electrode CSE1 in the third direction DR3 with the interlayer insulating layer 163 therebetween, and a storage capacitor may be formed therebetween. In some embodiments, the second capacitor electrode CSE2 and the second source/drain electrode SD2 may be integrally formed. A part of the integrated layer may include the second capacitor electrode CSE2, and the other part thereof may include the second source/drain electrode SD2.

The first data conductive layer 140 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The passivation layer 164 is on the first data conductive layer 140. The passivation layer 164 covers and protects the first data conductive layer 140. The passivation layer 164 may include an inorganic insulating material such as silicon oxide (SiOx), silicon nitride (SiNx), and/or silicon oxynitride (SiOxNy).

The second data conductive layer 150 is on the passivation layer 164. The second data conductive layer 150 includes a first voltage line VL2, a second voltage line VL1, and a first conductive pattern CDP.

A high-potential voltage (or a first power voltage) may be supplied to the second voltage line VL1, and a low-potential voltage (or a second power voltage), lower than the high-potential voltage (or the first power voltage) supplied to the first voltage line VL2, may be supplied to the second voltage line VL1.

The first voltage line VL2 may be electrically connected to the second contact electrode 420 so as to supply the low-potential voltage (the second power voltage) to the second contact electrode 420 to be described hereinbelow.

The first conductive pattern CDP may be electrically connected to the second capacitor electrode CSE2 integrated with the second source/drain electrode SD2 of the transistor through a contact hole penetrating the passivation layer 164.

The first conductive pattern CDP may be electrically connected to the first contact electrode 410 through a first contact hole CT1, which will be described hereinbelow, to transmit the first power voltage applied from the second voltage line VL1.

The second data conductive layer 150 may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof. However, the present disclosure is not limited thereto.

The via layer 165 is on the second data conductive layer 150. The via layer 165 may be on the passivation layer 164 on which the second data conductive layer 150 is formed. The via layer 165 may perform a surface planarization function of flattening a step formed by lower members included in the circuit element layer.

The via layer 165 may include an organic insulating material, for example, an organic material such as polyimide (PI).

Hereinafter, a structure of the light emitting element layer on the circuit element layer will be described in more detail.

Referring to FIGS. 2 and 3, the light emitting element layer may include a first bank 200, a second bank 300, a light emitting element ED, a first contact electrode 410, a second contact electrode 420, and a plurality of insulating layers 510 and 540, which are arranged on the via layer 165.

The first bank 200 may be on the via layer 165. The first bank 200 has a shape extending in the second direction DR2 in a plan view, but may have a shape in which both ends of the first bank 200 are terminated in one sub-pixel SPX such that they do not extend to another sub-pixel SPX neighboring in the second direction DR2.

The first bank 200 may be positioned over the light emission area EMA and the non-light emission area. The first bank 200 may be over other sub-pixels SPX neighboring in the first direction DR1. For example, the first bank 200 may be not only in the light emission areas EMA of the respective sub-pixels SPX neighboring in the first direction DR1 but also at the boundary thereof.

In one sub-pixel SPX, the first banks 200 may be at the left and right sides of one sub-pixel SPX in a plan view, and may be spaced apart from each other in the first direction DR1. The space formed by the first banks 200 spaced apart from each other at the left and the right side of the sub-pixel SPX may be a space in which the light emitting element ED, which will be described hereinbelow, is positioned.

The first bank 200 may be directly on the via layer 165 in a cross-sectional view. The first bank 200 may be directly on one surface of the via layer 165. The first bank 200 may include a structure in which at least a part of the first bank 200 protrudes from the upper surface of the via layer 165 in a cross-sectional view Each of the first banks 200 may include an upper surface, a lower surface, and a side surface. The lower surface of the first bank 200 is placed on the upper surface of the via layer 165. Each of the upper and lower surfaces of the first bank 200 is placed on one plane, and the plane where the upper surface thereof is located and the plane where the lower surface thereof is located are substantially in parallel, so that the overall thickness of the first bank 200 may be uniform.

Each of the first banks 200 may include an inclined side surface. When the first bank 200 includes the inclined side surface, the traveling direction of light emitted from the light emitting element ED and traveling toward the side surface of the first bank 200 may be changed to an upward direction (for example, a display direction). Accordingly, the first bank 200 may provide a space in which a plurality of light emitting elements ED are positioned, and may serve as a reflective partition wall that changes the traveling direction of light emitted from the light emitting element ED to the display direction.

Although it is shown in the drawings that each side surface of the first bank 200 is inclined in a linear shape, the present disclosure is not limited thereto. For example, each side surface of the first bank 200 may have a curved semi-circular or semi-elliptical shape.

The first bank 200 may include an organic material including a photosensitive material. For example, the first bank 200 may include an organic insulating material such as polyimide (PI), but the material thereof is not limited thereto.

The second bank 300 may be provided in the non-light emission area. The second bank 300 may be in the non-light emission area to surround the light emission area EMA for each sub-pixel SPX. The second bank 300 may be positioned across the boundary of the respective sub-pixels SPX to distinguish neighboring sub-pixels SPX. The second bank 300 may be in a grid pattern on the entire surface of the display area DA by including portions extending in the first direction DR1 and the second direction DR2 in a plan view.

The second bank 300 may be directly on the first bank 200 and/or the via layer 165. In one or more embodiments, a portion of the second bank 300 extending in the second direction DR2 may be on the first bank 200. The portion of the second bank 300 extending in the second direction DR2 may be on the first bank 200 at the boundary of the sub-pixels SPX neighboring in the first direction DR1. A portion of the second bank 300 extending in the first direction DR1 may be on the via layer 165. The portion of the second bank 300 extending in the first direction DR1 may be on the via layer 165 exposed by the first bank 200.

The second bank 300 may be directly on one surface of the first bank 200. The second bank 300 may be directly on one surface of the via layer 165 exposed by the first bank 200.

The second bank 300 may perform a function of preventing or reducing the overflow of ink to the adjacent sub-pixel SPX in the inkjet printing process of a process of manufacturing the display device 10. The second bank 300 may separate different light emitting elements ED for each sub-pixel SPX such that the light emitting elements dispersed in ink are not mixed with each other. The second bank 300 may serve to support an alignment mask 900 such that the alignment mask 900 (refer to FIG. 8) is mounted in a process of aligning the light emitting elements ED, which will be described hereinbelow.

The second bank 300 may include an organic material including a photosensitive material. For example, the second bank 300 may include an organic insulating material such as polyimide (PI), but the material thereof is not limited thereto.

The light emitting element ED may be provided between the first banks 200 in one sub-pixel SPX. The light emitting element ED may be between the side surfaces of the first banks 200 facing each other in one sub-pixel SPX.

The plurality of light emitting elements ED may be arranged to be spaced apart from each other along the second direction DR2 in which the first bank 200 extends, and may be aligned substantially parallel to each other. The distance between the light emitting elements ED spaced apart from each other is not particularly limited. Further, the light emitting element ED may have a shape extending in one direction. The extending direction of the first bank 200 and the extending direction of the light emitting element ED may cross each other (e.g., be substantially perpendicular to each other). However, the present disclosure is not limited thereto, and the light emitting element ED may be positioned at an angle, without being perpendicular, to the direction in which the first bank 200 extends.

The light emitting element ED may be on the via layer 165 in a space between the first banks 200. The light emitting element ED may be directly on one surface of the via layer 165. Both ends of the light emitting element ED may face the side surface of the first bank 200.

The first insulating layer 510 may be on the light emitting element ED. The first insulating layer 510 may be partially on the light emitting element ED. The first insulating layer 510 may partially surround the outer surface of the light emitting element ED, and may thus not cover one end and the other end of the light emitting element ED. The first insulating layer 510 may form a linear or island-shaped pattern in one sub-pixel SPX on the light emitting element ED in a plan view. The first insulating layer 510 may serve to protect the light emitting element ED, and may serve to fix the light emitting element ED so as to prevent or reduce the risk of a loss of the light emitting element ED during the process of manufacturing the display device 10.

The first contact electrode 410 and the second contact electrode 420 may be on the first bank 200, the second bank 300, and the via layer 165, respectively. The first contact electrode 410 and the second contact electrode 420 may be on the via layer 165 exposed by the light emitting element ED.

The first contact electrode 410 and the second contact electrode 420 may have a shape extending in the second direction DR2 in a plan view. The first contact electrode 410 and the second contact electrode 420 may be spaced apart from each other and face each other in the first direction DR1. The first contact electrode 410 and the second contact electrode 420 may form a stripe pattern in each sub-pixel SPX. The first contact electrode 410 and the second contact electrode 420 may overlap a part of the first bank 200 and a part of the second bank 300 in the third direction DR3.

The first contact electrode 410 may extend in the second direction DR2 and may partially overlap the via layer 165 exposed by the first bank 200. The first contact electrode 410 may be in contact with the first conductive pattern CDP through the first contact hole CT1 penetrating the via layer 165. The first contact electrode 410 may be electrically connected to the transistor through the first conductive pattern CDP.

The second contact electrode 420 may extend in the second direction DR2 and may partially overlap the via layer 165 exposed by the first bank 200. The second contact electrode 420 may contact the first voltage line VL2 through the second contact hole CT2 penetrating the via layer 165. For example, the second contact electrode 420 may be electrically connected to the first voltage line VL2 through the second contact hole CT2.

Although it is shown in the drawings that the first contact hole CT1 and the second contact hole CT2 are in the light emission area EMA, the present disclosure is not limited thereto. For example, the first contact hole CT1 and the second contact hole CT2 may overlap the second bank 300.

The first contact electrode 410 and the second contact electrode 420 may be on the first bank 200 and the second bank 300 at the left and right sides of one sub-pixel SPX, respectively. The contact electrode 410 and the second contact electrode 420 may be on the first bank 200 and the second bank 300 to cover the outer surfaces of the first bank 200 and the second bank 300. Specifically, the first contact electrode 410 and the second contact electrode 420 may be on the upper surface and side surface of the second bank 300 on the first bank 200, and may extend outward (e.g., along the first direction DR1) on the second bank 300, and may thus be on the upper surface and side surface of the first bank 200 exposed by the second bank 300. The first contact electrode 410 and the second contact electrode 420 may extend outward (e.g. along the first direction DR1) from the side surface of the first bank 200, and may thus also be on a part of the upper surface of the via layer 165.

The first contact electrode 410 may be in contact with one end of the light emitting element ED. The second contact electrode 420 may be in contact with the other end of the light emitting element ED. In one or more embodiments, the first contact electrode 410 may be in contact with one end of the light emitting element ED exposed by the first insulating layer 510, and the second contact electrode 420 may be in contact with the other end of the light emitting element ED exposed by the first insulating layer 510. The first and second contact electrodes 410 and 420 may be spaced apart from each other on the first insulating layer 510. The first and second contact electrodes 410 and 420 may be electrically insulated from each other.

A part of the first contact electrode 410 may be in contact with the first conductive pattern CDP through the first contact hole CT1, and the other part of the first contact electrode 410 may be in contact with one end of the light emitting element ED. One end of the light emitting element ED may be electrically connected to the transistor through the first contact electrode 410.

A part of the second contact electrode 420 may be in contact with the first voltage line VL2 through the second contact hole CT2, and the other part of the second contact electrode 420 may be in contact with the other end of the light emitting element ED. The other end of the light emitting element ED may be electrically connected to the first voltage line VL2 through the second contact electrode 420.

The first and second contact electrodes 410 and 420 may be in contact with one end and the other end of the light emitting element ED, respectively, to apply a predetermined (or set) voltage such that the light emitting element ED emits light. For example, the first and second contact electrodes 410 and 420 may receive electrical signals through the first conductive pattern CDP and the first voltage line VL2, respectively, and may transmit the electrical signals to the light emitting element ED.

The first and second contact electrodes 410 and 420 may include a conductive material. For example, the first and second contact electrodes 410 and 420 may include ITO, IZO, ITZO, and/or aluminum (Al). As an example, the first and second contact electrodes 410 and 420 may include a transparent conductive material, but the material thereof is not limited thereto.

The second insulating layer 540 may be entirely on the first substrate SUB1. The second insulating layer 540 may function to protect members on the first substrate SUB1 from external environments.

Each of the first insulating layer 510 and the second insulating layer 540 may include an inorganic insulating material and/or an organic insulating material. In one or more embodiments, the first insulating layer 510 or the second insulating layer 540 may each independently include an inorganic insulating material such as silicon oxide (SiOx), silicon nitride (SiNx), silicon oxynitride (SiOxNy), aluminum oxide ($Al_2O_3$), and/or aluminum nitride (AlN). In one or more embodiments, the first insulating layer 510 or the second insulating layer 540 may each independently include an organic insulating material such as acrylic resin, epoxy resin, phenolic resin, polyamide resin, polyimides resin, unsaturated polyester resin, polyphenylene resin, polyphenylene sulfide resin, benzocyclobutene, cardo resin, siloxane resin, silsesquioxane resin, polymethyl methacrylate, polycarbonate, and/or polymethyl methacrylate-polycarbonate synthetic resin. However, the present disclosure is not limited thereto.

Figure 4:
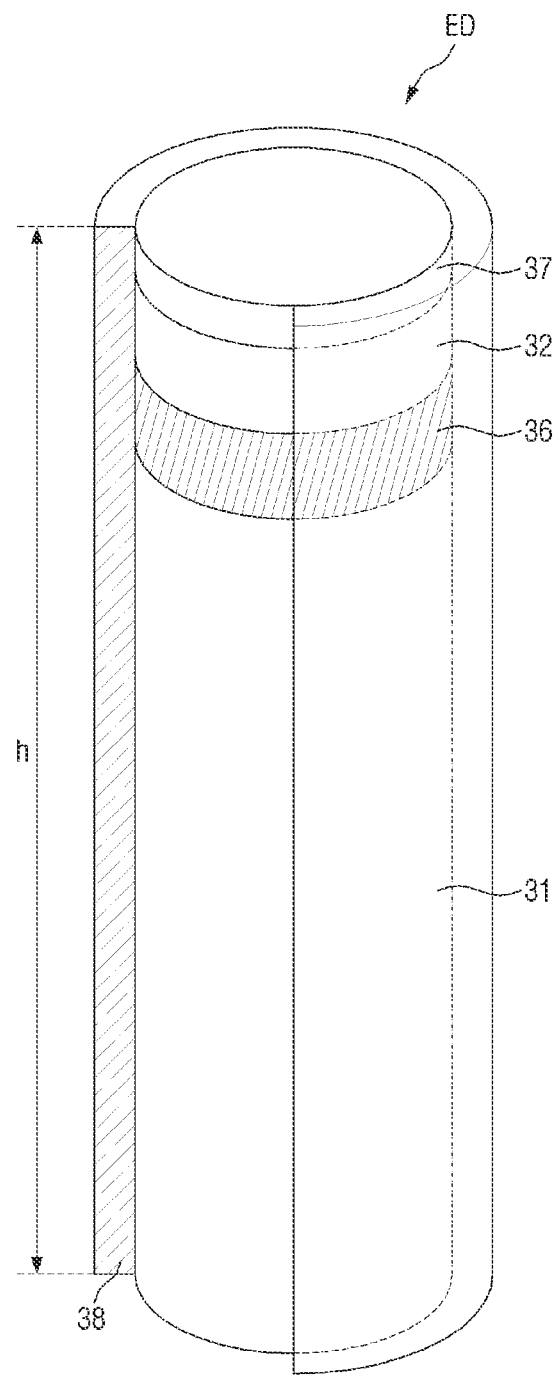
FIG. 4 is a schematic perspective view of a light emitting element according to one or more embodiments.

FIG. 4 is a schematic perspective view of a light emitting element according to one or more embodiments.

The light emitting element ED may be a light emitting diode. For example, the light emitting element ED may be an inorganic light emitting diode having a size of micrometer or nanometer and including an inorganic material. When an electric field is formed in a specific (or set) direction between two electrodes facing each other, the inorganic light emitting diode may be aligned between the two electrodes having a polarity formed thereon. The light emitting element ED may be aligned between the electrodes by an electric field formed on the two electrodes.

The light emitting element ED according to one or more embodiments may have a shape extending in one direction. The light emitting element ED may have a shape such as a rod, a wire, and/or a tube. In one or more embodiments, the light emitting element ED may be cylindrical and/or rod-shaped. However, the shape of the light emitting element ED is not limited thereto, and the light emitting element ED may have a shape such as a regular cube, a rectangular parallelepiped, or a polygonal column such as hexagonal column, or may have a shape extending in one direction and having a partially inclined outer surface. That is, the light emitting element may have various suitable shapes. A plurality of semiconductors included in the light emitting element ED, which will be described hereinbelow, may have a structure in which they are sequentially arranged or stacked along the one direction.

The light emitting element ED may include a semiconductor layer doped with any conductive type (for example, p-type or n-type) impurity. The semiconductor layer may emit light of a specific (or set) wavelength band by transmission of an electric signal applied from an external power source.

Referring to FIG. 4, the light emitting element ED may include a first semiconductor layer 31, a second semiconductor layer 32, a light emitting layer 36, an electrode layer 37, and an insulating layer 38.

The first semiconductor layer 31 may be an n-type semiconductor layer. For example, when the light emitting element emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). The semiconductor material may be at least one of AlGaInN, GaN, AlGaN, InGaN, AlN, or InN, each being doped with n-type impurities. The first semiconductor 31 may be doped with an n-type dopant, and for example, the n-type dopant may be Si, Ge, and/or Sn. In one or more embodiments, the first semiconductor layer 31 may be n-GaN doped with n-type Si.

The second semiconductor layer 32 is on the light emitting layer 36 to be described hereinbelow. The second semiconductor layer 32 may be a p-type semiconductor layer. For example, when the light emitting element ED emits light of a blue wavelength band or a green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the semiconductor material may be at least one of AlGaInN, GaN, AlGaN, InGaN, AlN, or InN, each being doped with p-type impurities. The second semiconductor layer 32 may be doped with a p-type dopant, and for example, the second dopant may be Mg, Zn, Ca, Se, and/or Ba. In one or more embodiments, the second semiconductor layer 32 may be p-GaN doped with p-type Mg.

Meanwhile, although it is shown in FIG. 4 that each of the first semiconductor layer 31 and the second semiconductor layer 32 is formed as one layer, the present disclosure is not limited thereto. In some embodiments, each of the first semiconductor layer 31 and the second semiconductor layer 32 may further include a larger number of layers, for example, clad layers and/or tensile strain barrier reducing (TSBR) layers depending on the material of the light emitting layer 36.

The light emitting layer 36 is between the first semiconductor layer 31 and the second semiconductor layer 32. The light emitting layer 36 may include a material of a single or multiple quantum well structure. When the light emitting layer 36 includes a material of a multiple quantum well structure, the light emitting layer 36 may have a structure in which quantum layers and well layers are alternately laminated. The light emitting layer 36 may emit light by the combination of electron-hole pairs according to an electrical signal applied through the first semiconductor layer 31 and the second semiconductor layer 32. For example, when the light emitting layer 36 is to emit light of a blue wavelength band, the light emitting layer 36 may include a material such as AlGaN and/or AlGaInN. For example, when the light emitting layer 36 has a multiple quantum well structure in which quantum layers and well layers are alternately laminated, the quantum layers may include a material such as AlGaN and/or AlGaInN, and the well layers may include a material such as GaN and/or AlInN. In one or more embodiments, the light emitting layer 36 includes quantum layers each containing AlGaInN and well layers each containing AlInN, and thus the light emitting layer 36 may emit blue light having a central wavelength band of about 450 nm to about 495 nm.

However, the present disclosure is not limited thereto, and the light emitting layer 36 may have a structure in which semiconductor materials having high bandgap energy and semiconductor materials having low bandgap energy are alternately laminated, and may include other group 3 to group 5 semiconductor materials depending on the wavelength bad of light. The light emitted from the light emitting layer 36 is not limited to light of a blue wavelength band, and in some cases, the light emitting layer 36 may emit light of a red or green wavelength band.

Meanwhile, the light emitted from the light emitting layer 36 may be emitted not only to the outer surface of the light emitting element ED in the length direction, but also to both side surfaces thereof in the length direction.

The electrode layer 37 may be an ohmic contact electrode. However, the present disclosure is not limited thereto, and the electrode layer 37 may be a Schottky contact electrode. The light emitting element ED may include at least one electrode layer 37. Although it is shown in FIG. 4 that the light emitting element ED includes one electrode layer 37, the present disclosure is not limited thereto. In some embodiments, the light emitting element ED may include a larger number of electrode layers 37, or the electrode layer 37 may be omitted. The description of the light emitting element ED to be described later may be equally applied even if the number of electrode layers 37 is changed or the light emitting element ED includes other structures.

In the display device 10 according to one or more embodiments, when the light emitting element ED is electrically connected to the above-described first and second contact electrodes 410 and 420, the electrode layer 37 may reduce a resistance between the light emitting element ED and first and second contact electrodes 410 and 420. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), or indium tin-zinc oxide (ITZO). The electrode layer 37 may include a semiconductor material doped with n-type or p-type impurities. The electrode layer 370 may include the same material, and may include different materials from each other, but the present disclosure is not limited thereto.

The insulating layer 38 may surround the outer surfaces of the plurality of semiconductors and electrode layers. In one or more embodiments, the insulating layer 38 may surround at least the outer surface of the light emitting layer 36, and may extend in one direction in which the light emitting element ED extends. The insulating layer 38 may function to protect the above-described members. For example, the insulating layer 38 may be formed to surround the side surfaces of the members, and may be formed such that both ends of the light emitting element ED in the length direction are exposed.

Although it is shown in the drawing that the insulating layer 38 extends in the length direction of the light emitting element ED to cover the first semiconductor layer 31 to the side surface of the electrode layer 37, the present disclosure is not limited thereto. The insulating layer 38 may cover only the outer surfaces of some of the semiconductor layers including the light emitting layer 36, or may cover only a part of the outer surface of the electrode layer 37 to partially expose the outer surface of each electrode layer 37. In one or more embodiments, the insulating layer 38 may have a rounded upper surface in a cross section in an area adjacent to at least one end of the light emitting element ED.

The thickness of the insulating layer 38 may be in a range of about 10 nm to about 1.0 μm, but is not limited thereto. For example, the thickness of the insulating layer 38 may be about 40 nm.

The insulating layer 38 may include a material having insulating properties, for example, silicon oxide (SiOx), silicon nitride (SiNx), silicon oxynitride (SiOxNy), aluminum nitride (AlN), and/or aluminum oxide ($Al_2O_3$). Thus, the insulating layer 38 may prevent or reduce the occurrence of an electrical short circuit that may occur when the light emitting layer 36 is in direct contact with an electrode through which an electrical signal is transmitted to the light emitting element ED. Further, because the insulating layer 38 protects the outer surface of the light emitting element ED, as well as the light emitting layer 36, it is possible to prevent or reduce the deterioration in light emission efficiency.

In some embodiments, the outer surface of the insulating layer 38 may be surface-treated. The light emitting elements ED may be aligned by being sprayed onto the electrodes in a state in which they are dispersed in a predetermined (or specific) ink. Here, the surface of the insulating layer 38 may be hydrophobically or hydrophilically treated in order to maintain the light emitting elements ED in a dispersed state without being aggregated with other adjacent light emitting elements ED in the ink.

The light emitting element ED may have a length h of about 1 μm to about 10 μm or about 2 μm to about 6 μm, and for example, about 3 μm to about 5 μm. Further, the light emitting element ED may have a diameter of about 300 nm to about 700 nm, and may have an aspect ratio of about 1.2 to 100. However, the present disclosure is not limited thereto, and the plurality of light emitting elements ED included in the display device 10 may have different diameters from each other according to a difference in composition of the light emitting layer 36. For example, the light emitting element may have a diameter of about 500 nm.

Figure 5:
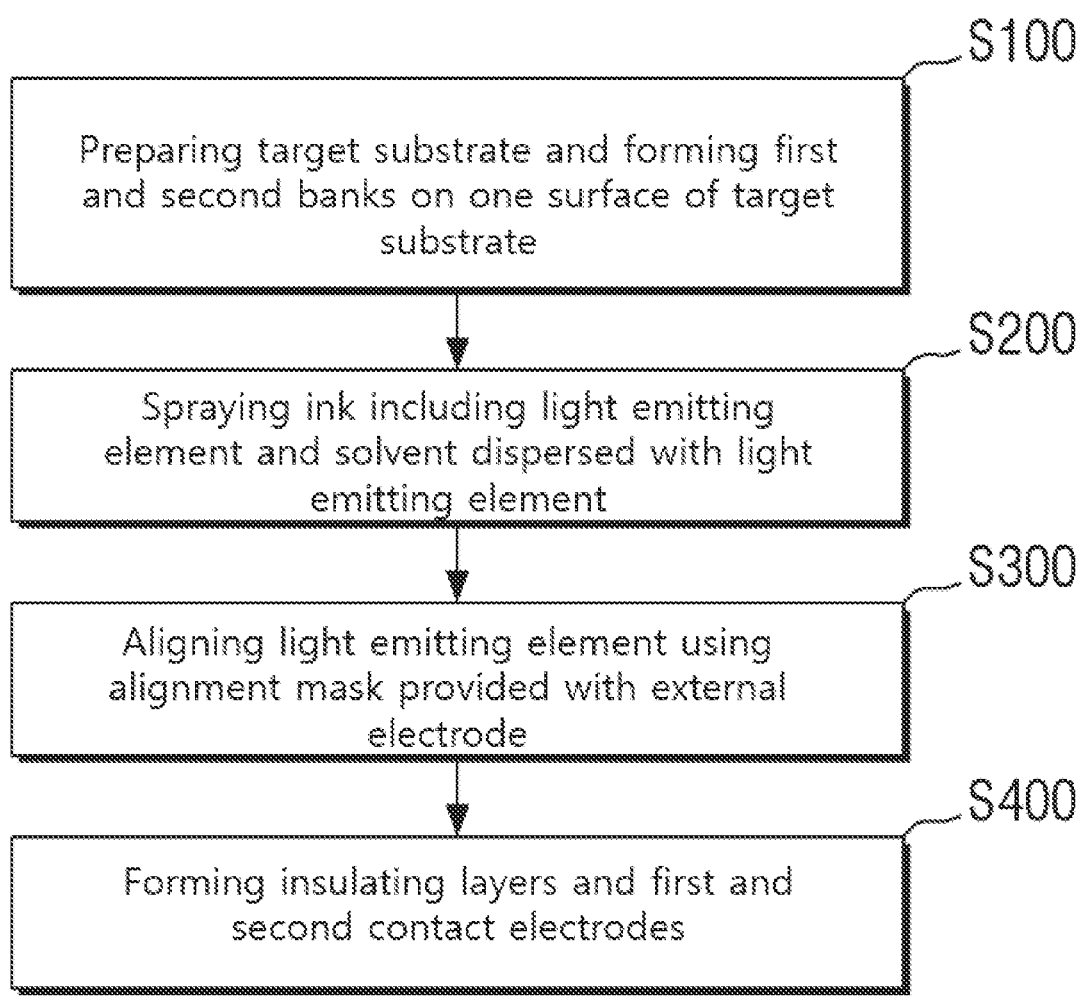
FIG. 5 is a flowchart illustrating a method of manufacturing a display device according to one or more embodiments.

FIG. 5 is a flowchart illustrating a method of manufacturing a display device according to one or more embodiments. FIGS. 6 to 11 are cross-sectional views and plan views of processes of a method of manufacturing a display device according to one or more embodiments.

Referring to FIG. 5, a method of manufacturing a display device according to one or more embodiments may include the steps of: preparing a target substrate and forming first and second banks on the target substrate (S100); spraying an ink onto the target substrate, the ink including light emitting elements and a solvent dispersed with the light emitting elements (S200); aligning the light emitting elements using an alignment mask including an external alignment electrode (S300); and forming a plurality of insulating layers and first and second contact electrodes (S400).

First, a target substrate 1000 is prepared, and a first bank 200 and a second bank 300 are formed on the target substrate 1000 (S100 of FIG. 5).

Figure 6:
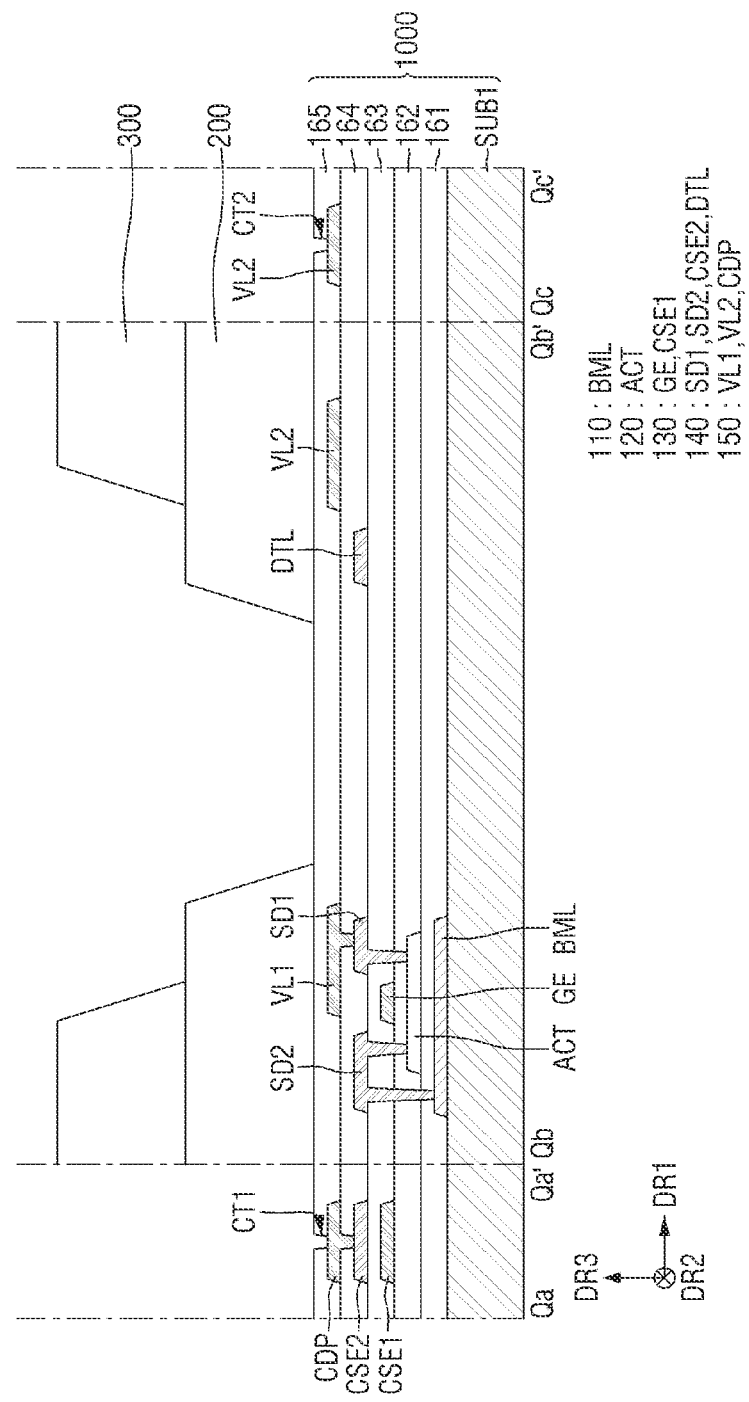
FIGS. 6 to 11 are cross-sectional views and plan views of processes of a method of manufacturing a display device according to one or more embodiments.

Specifically, referring to FIGS. 5 and 6, the target substrate 1000 may include a first substrate SUB1 and a circuit element layer on the first substrate SUB1. In one or more embodiments, the target substrate 1000 may include a first substrate SUB1 and a plurality of circuit elements including a plurality of conductive layers and a plurality of insulating layers on the first substrate SUB1. First and second contact holes CT1 and CT2 penetrating a via layer 165 to expose a part of a first conductive pattern CDP and a part of a first voltage line VL2 may be formed in the via layer 165.

First and second banks 200 and 300 may be formed on the via layer 165 of the target substrate 1000. A plurality of pixels PX and a plurality of sub-pixels SPX may be defined on the target substrate 1000. The first bank 200 may be positioned across the sub-pixels SPX neighboring in the first direction DR1 to provide a space in which the light emitting element ED is disposed, and the second bank 300 may be at the boundary of the sub-pixels SPX to prevent or reduce the overflow of ink to the adjacent sub-pixel SPX in an inkjet process to be described hereinbelow.

The first bank 200 and the second bank 300 may be formed through a conventional (e.g., any suitable) deposition process or a conventional (e.g., any suitable) mask process. The structure and arrangement of the first bank 200 and the second bank 300 have been described as above. Hereinafter, redundant descriptions of the structure and/or arrangement relationship of each member will not be provided, and the formation order thereof will be described in more detail.

Subsequently, an ink I including light emitting elements ED and a solvent SV dispersed with the light emitting elements ED is sprayed onto the target substrate 1000 (S200 of FIG. 5).

Figure 7:
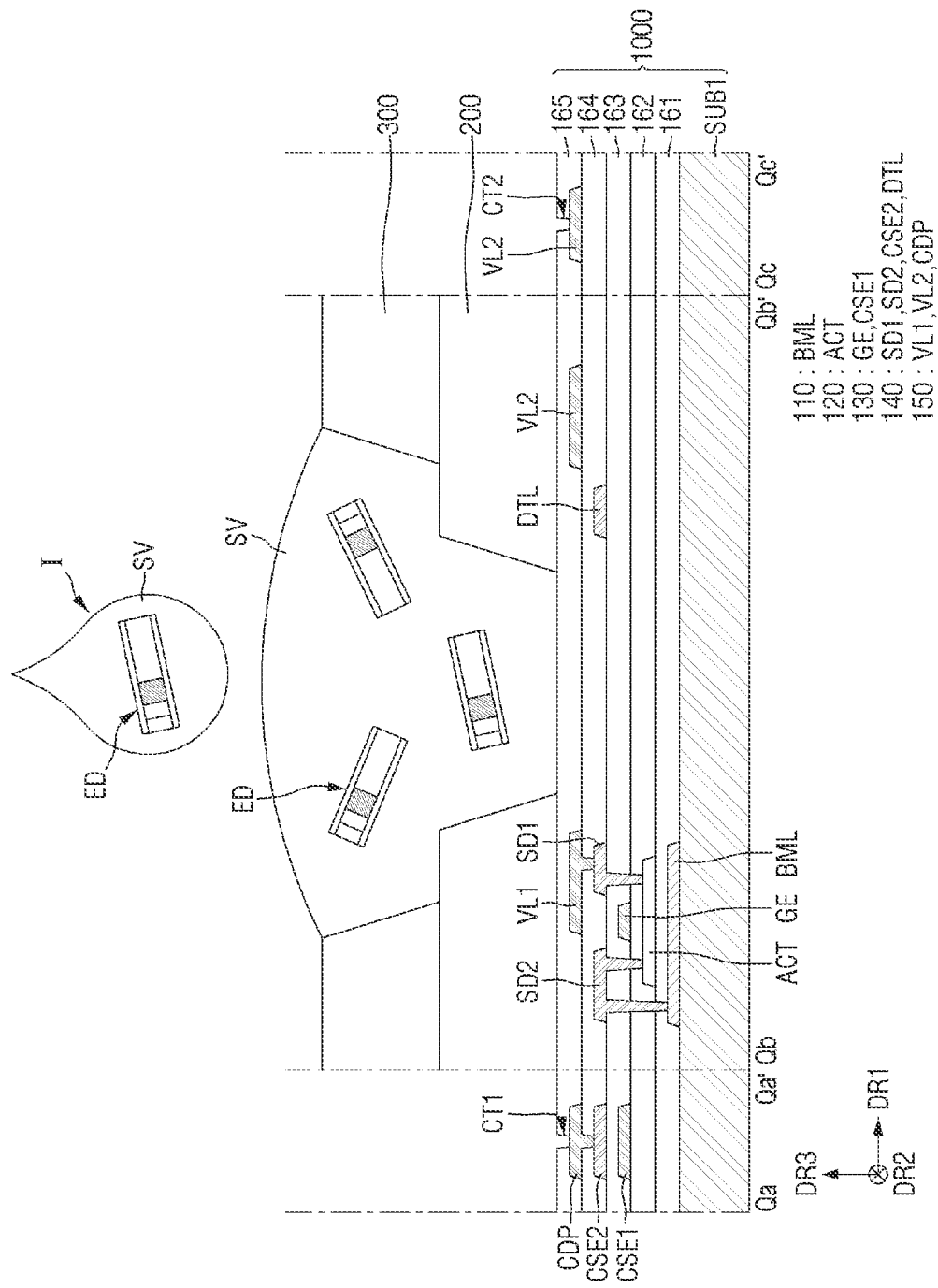

Specifically, referring to FIGS. 5 and 7, an ink I including light emitting elements ED and a solvent SV dispersed with the light emitting elements ED is sprayed onto the target substrate 1000 in an area surrounded by the second bank 300. The solvent SV may be acetone, water, alcohol, toluene, and/or the like. The solvent SV may be a material that is vaporized or volatilized at room temperature or by heat.

In one or more embodiments, the ink I may be sprayed onto the target substrate 1000 by a printing process using an inkjet printing apparatus. The light emitting element ED sprayed onto the target substrate 1000 may be mounted in a region defined by the first and second banks 200 and 300 in the sub-pixel SPX.

Subsequently, the light emitting elements ED are aligned using an alignment mask 900 provided with an external alignment electrode RMT (S300 of FIG. 5).

Referring to FIGS. 5 and 8 to 10, the process of aligning the light emitting elements ED may be performed using an alignment mask 900 provided with an external alignment electrode RMT. The alignment mask 900 may serve to generate an electric field in an area defined by the first and second banks 200 and 300.

In one or more embodiments, the alignment mask 900 may be over the target substrate 1000. The alignment mask 900 may be mounted on the upper surface of the second bank 300 on the target substrate 1000. However, the present disclosure is not limited thereto, and the alignment mask 900 may be positioned on the second bank 300 through a separate support.

Figure 9:
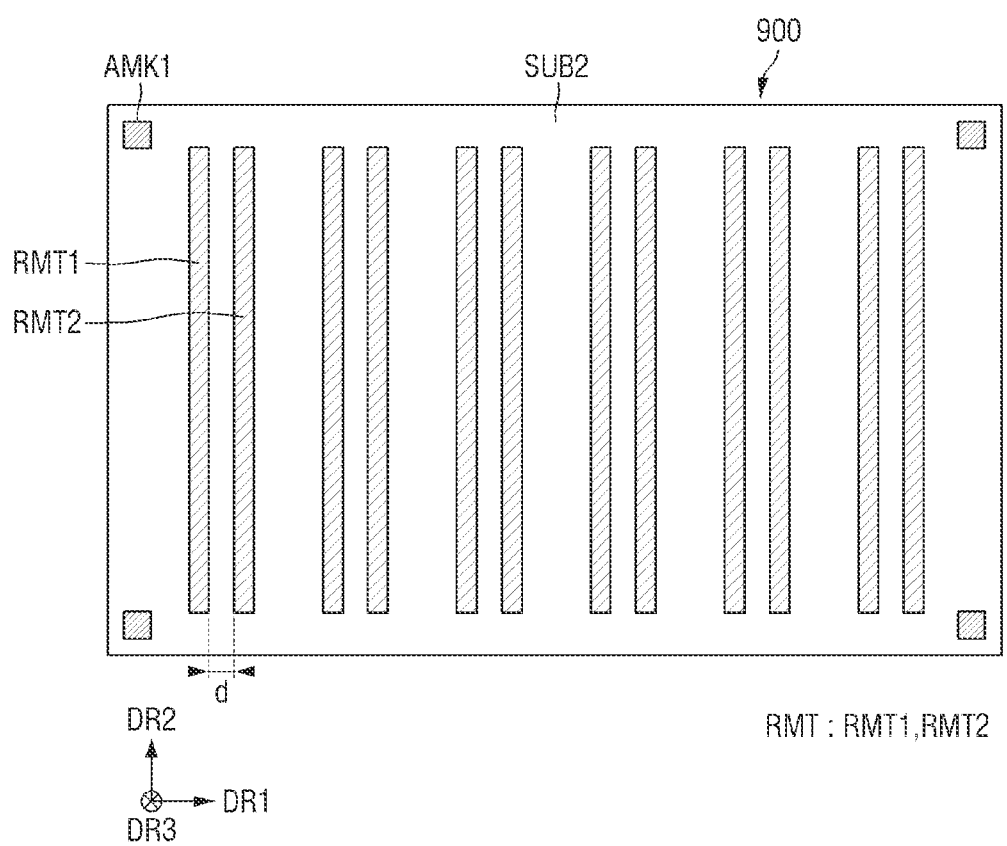

Referring to FIG. 9, the alignment mask 900 may include a base substrate SUB2, and an external alignment electrode RMT and a first alignment mark AMK1 on one surface of the base substrate SUB2.

The base substrate SUB2 may be a printed circuit board or a flexible circuit board, or may be an insulating substrate including an insulating material such as polyimide (PI).

The base substrate SUB2 may have a rectangular shape including long sides in the first direction DR1 and short sides in the second direction DR2 in a plan view. However, the present disclosure is not limited thereto, and the planar shape of the base substrate SUB2 may depend on the planar shape of the first substrate SUB1 of the display device 10.

The external alignment electrode RMT and the first alignment mark AMK1 may be on one surface of the base substrate SUB2.

The external alignment electrode RMT may serve to form an electric field in the sub-pixel SPX to align the light emitting elements ED. For example, the external alignment electrode RMT may generate an electric field IEL on the target substrate 1000 to align the light emitting elements ED. When a power is supplied to the external alignment electrode RMT and a current flows through the external alignment electrode RMT, electromagnetic waves are generated to form an electric field IEL having an equipotential surface on the external alignment electrode RMT. As such, the external alignment electrode RMT may be an electrode to which an alignment signal for aligning the light emitting elements ED sprayed on the target substrate 1000 is applied.

The external alignment electrode RMT may be formed of a conductive material such as silver (Ag) and/or copper (Cu).

The external alignment electrode RMT may include a first alignment electrode RMT1 and a second alignment electrode RMT2.

Each of the first alignment electrode RMT1 and the second alignment electrode RMT2 may have a shape extending in the second direction DR2 in a plan view. The first alignment electrode RMT1 and the second alignment electrode RMT2 may be spaced apart from each other in the first direction DR1 on one surface of the base substrate SUB2.

When an alignment signal is applied to the first and second alignment electrodes RMT1 and RMT2, an electric field IEL may be formed between the first alignment electrode RMT1 and the second alignment electrode RMT2. When the light emitting element ED is placed in the electric field IEL formed between the first alignment electrode RMT1 and the second alignment electrode RMT2, the light emitting element ED may receive a dielectrophoretic force due to the electric field IEL. The light emitting element ED subjected to the dielectrophoretic force may be mounted in an area where the first alignment electrode RMT1 and the second alignment electrode RMT2 overlap each other, and an area between the first alignment electrode RMT1 and the second alignment electrode RMT2, while the alignment direction and position of the light emitting element ED are changed.

At least one first alignment mark AMK1 may be on the edge of the base substrate SUB2 on one surface of the base substrate SUB2. In one or more embodiments, the first alignment mark AMK1 may be formed at a corner of the base substrate SUB2. Although it is shown in FIG. 9 that four first alignment marks AMK1 are formed at four corners of the base substrate SUB2, respectively, the present disclosure is not limited thereto. Although it is shown in FIG. 9 that the first alignment mark AMK1 has a square planar shape, the present disclosure is not limited thereto. For example, the planar shape of the first alignment mark AMK1 may be replaced with various suitable shapes.

Figure 8:
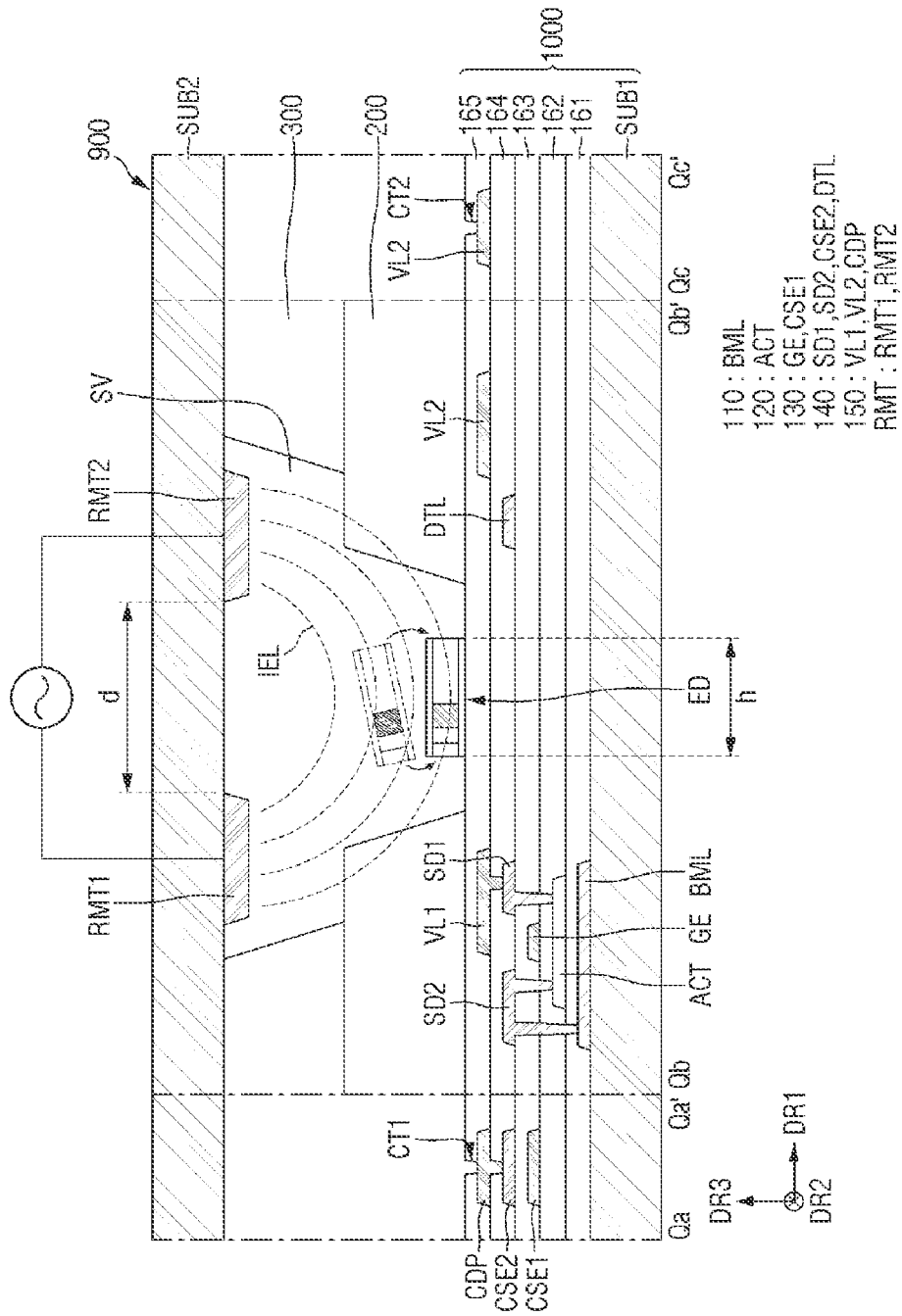
Figure 10:
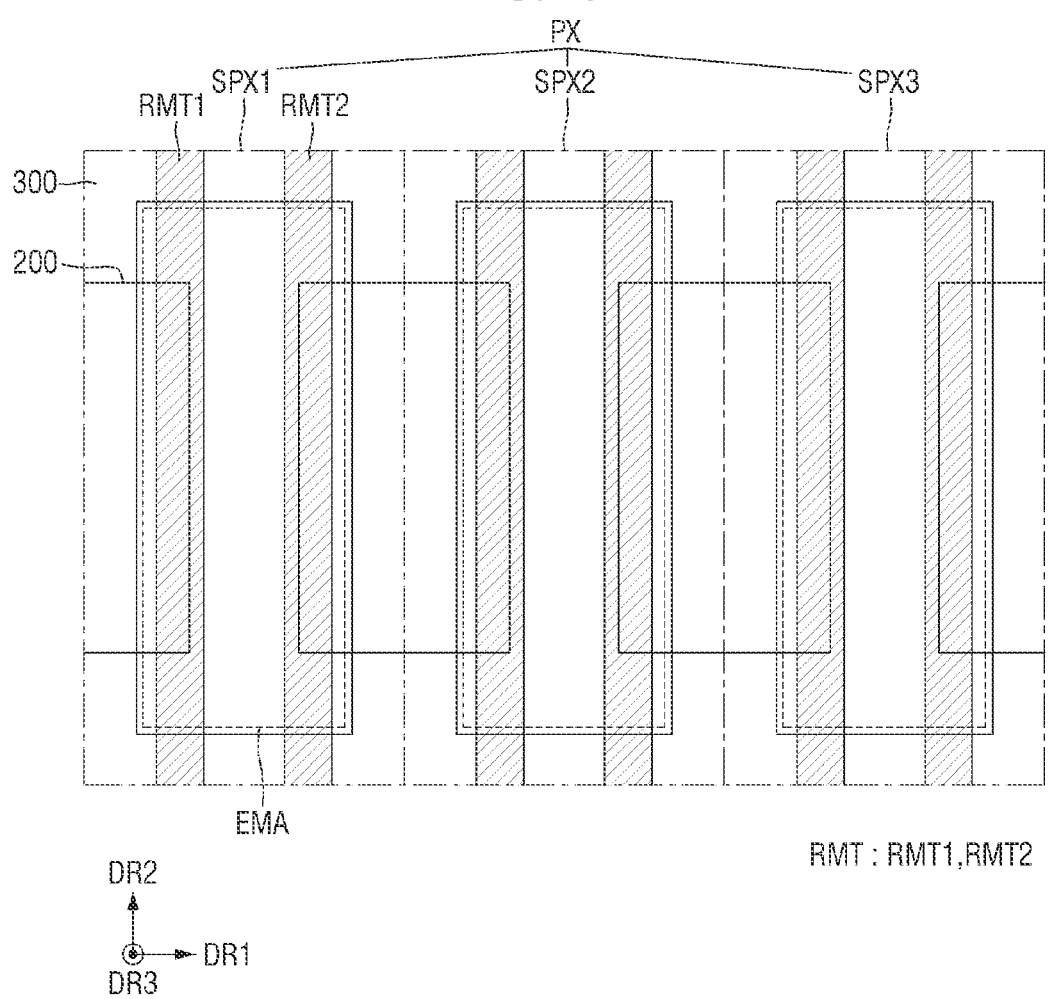

Referring to FIGS. 8 and 10, in the process of aligning the light emitting elements ED using the alignment mask 900, in order to align the light emitting elements ED at a specific (or set) position, for example, in a region between the first banks 200 facing each other in the sub-pixel SPX, the relative arrangement relationship between the external alignment electrode RMT of the alignment mask 900 and the sub-pixel SPX of the target substrate 1000 may be important.

The alignment mask 900 may be on the target substrate 1000 using the first alignment mark AMK1. The alignment mask 900 may be such that one surface of the base substrate SUB2 on which the external alignment electrode RMT is formed faces the upper surface of the first substrate SUB1 of the target substrate 1000.

The alignment mask 900 may be located such that the first alignment electrode RMT1 and the second alignment electrode RMT2 are in the light emission area EMA of each sub-pixel SPX. The first alignment electrode RMT1 may overlap the first bank 200 at the left side of the sub-pixel SPX in the third direction DR3 in a plan view. The second alignment electrode RMT2 may overlap the first bank 200 at the right side of the sub-pixel SPX in the third direction DR3 in a plan view. In one sub-pixel SPX, the space between the first alignment electrode RMT1 and the second alignment electrode RMT2 may overlap an area in which the light emitting element ED is positioned.

The distance d between the first alignment electrode RMT1 and the second alignment electrode RMT2 in the first direction DR1 may be greater than the length h of the light emitting element ED in the extending direction. Because the distance d between the first alignment electrode RMT1 and the second alignment electrode RMT2 in the first direction DR1 is greater than the length h of the light emitting element ED in the extending direction, the light emitting element ED may be placed by an electric field IEL formed between the first alignment electrode RMT1 and the second alignment electrode RMT2.

When the alignment mask 900 is on the second bank 300, an alignment signal may be applied to the first alignment electrode RMT1 and the second alignment electrode RMT2. AC power or DC power may be applied to the alignment signal. An electric field IEL may be formed on the first alignment electrode RMT1 and the second alignment electrode RMT2 by the alignment signal. Because the alignment mask 900 is positioned such that the via layer 165 faces one surface of the base substrate SUB2 on which the first alignment electrode RMT1 and the second alignment electrode RMT2 are formed, the electric field may be generated in the ink I sprayed on the target substrate 1000. Accordingly, the light emitting element ED dispersed in the solvent SV of the ink I receives electrical force (attractive force and repulsive force) by the electric field IEL, so that the alignment direction of the light emitting element ED may be controlled.

Figure 11:
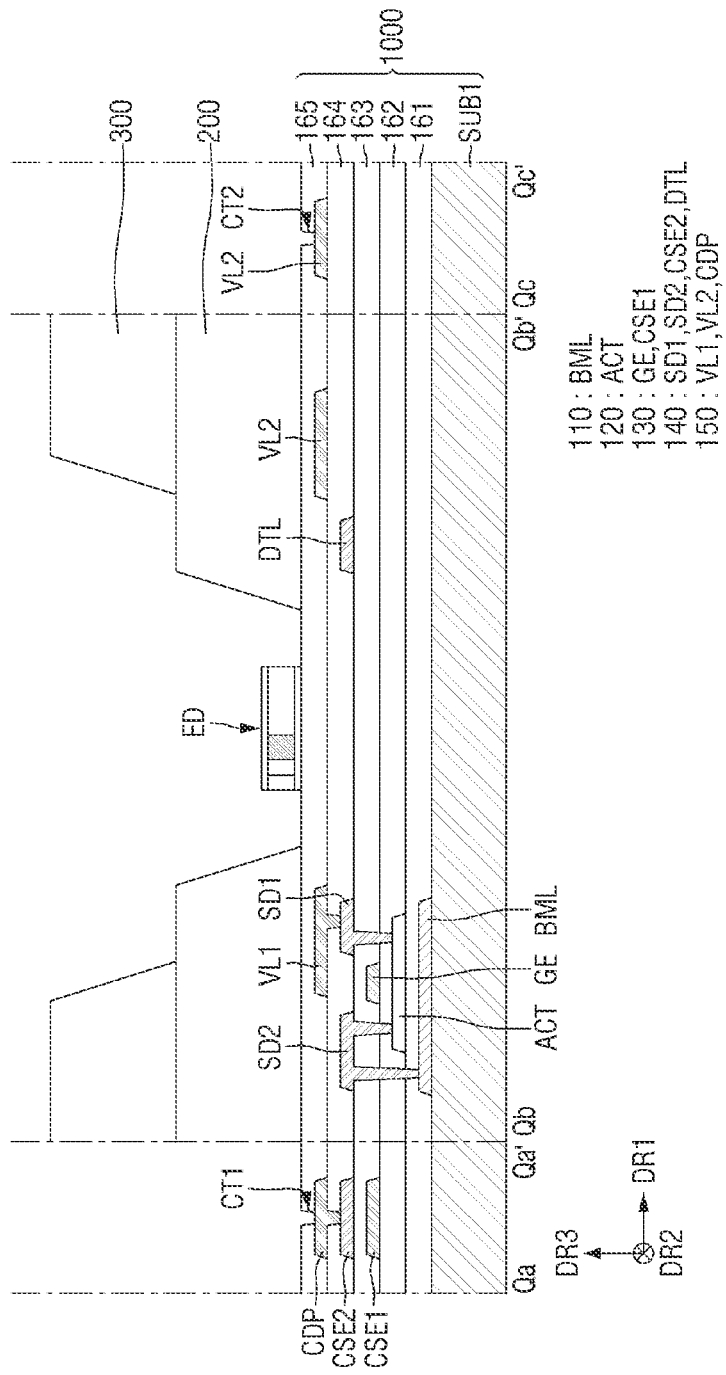

Subsequently, referring to FIG. 11, when the light emitting element ED is aligned between the first banks 200, the light emitting element ED may be mounted on the via layer 165 by removing the solvent SV of the ink I. The process of removing the solvent (SV) may be performed through a conventional or any suitable heat treatment or light irradiation process. The heat treatment or light irradiation process may be performed to such a degree that only the solvent SV may be selectively removed within a range in which the light emitting element ED is not damaged.

Subsequently, referring to FIG. 3, a first insulating layer 510 may be formed on the light emitting element ED. The first insulating layer 510 may function to fix the light emitting elements ED arranged between the first banks 200. The light emitting elements ED on which the first insulating layer 510 is formed may not change their initial alignment positions in the subsequent processes.

Subsequently, a first contact electrode 410 and a second contact electrode 420 may be formed on the first insulating layer 510. The first contact electrode 410 and the second contact electrode 420 may be formed by patterning through the same mask process. However, the present disclosure is not limited thereto, and the first contact electrode 410 and the second contact electrode 420 may be formed by a separate mask process.

Through this process, a part of the first contact electrode 410 may be in contact with the first conductive pattern CDP through the first contact hole CT1 penetrating the via layer 165 to be electrically connected to a transistor, and the other part of the first contact electrode 410 may be in contact with one end of the light emitting element ED to be electrically connected to the light emitting element ED. Further, a part of the second contact electrode 420 may be in contact with the first voltage line VL2 through the second contact hole CT2 penetrating the via layer 165 to be electrically connected to the transistor, and the other part of the second contact electrode 420 may be in contact with the other end of the light emitting element ED to be electrically connected to the light emitting element ED.

Subsequently, a second insulating layer 540 may be formed on the entire surface of the first substrate SUB1 to manufacture a display device 10.

The method of manufacturing the display device 10 may include a process of aligning the light emitting element ED (e.g., a plurality of light emitting elements ED) at a specific (or set) position in one sub-pixel SPX. In the method of manufacturing the display device 10 according to the present embodiments, the process of aligning the light emitting element ED may be performed using an alignment mask 900 provided with an external alignment electrode RMT. Because the process of aligning the light emitting element ED is performed using an alignment mask 900 provided with first and second alignment electrodes RMT1 and RMT2, a separate alignment electrode for aligning the light emitting element ED in the display device 10 may not be required. Because the display device 10 does not include a separate alignment electrode, a separate mask process for forming an alignment electrode may be omitted, and thus the process efficiency of the display device 10 may be improved.

Figure 12:
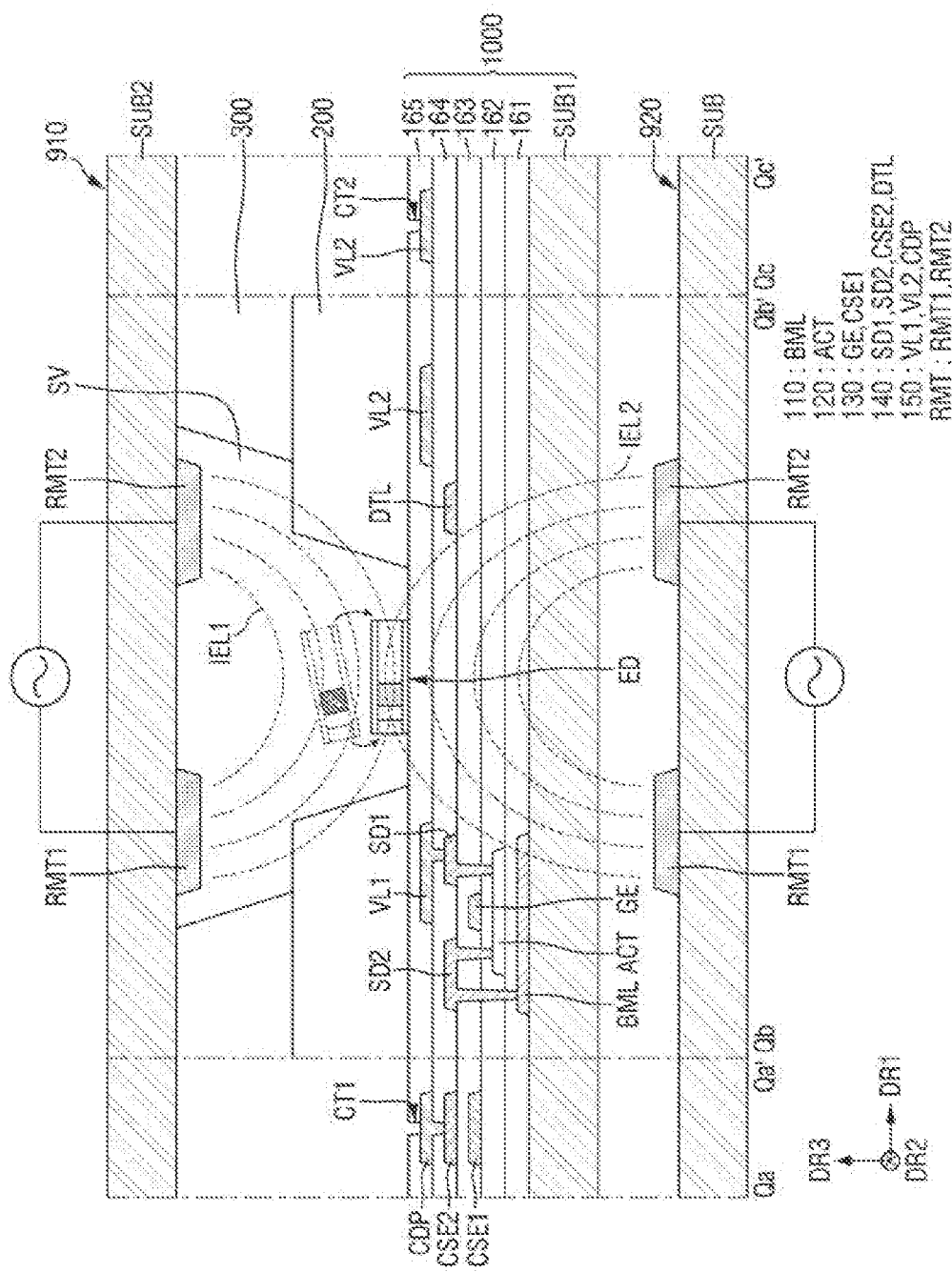
FIG. 12 is a cross-sectional view illustrating another example of an alignment process of a light emitting element.

FIG. 12 is a cross-sectional view illustrating one or more other embodiments of an alignment process of a light emitting element.

Referring to FIG. 12, the present embodiment is different from the embodiment of FIG. 8 in that, in the process of aligning the light emitting element ED, alignment masks are provided over and under the display device 10.

The process of aligning the light emitting element ED may be performed using a first alignment mask 910 and a second alignment mask 920. Because each of the first alignment mask 910 and the second alignment mask 920 is substantially the same as the above-described alignment mask 900 of FIG. 8, a detailed description of structures thereof will not be provided.

The first alignment mask 910 may be over the target substrate 1000, and the second alignment mask 920 may be under the target substrate 1000.

In the first alignment mask 910, one surface of the base substrate SUB2 on which the first alignment electrode RMT1 and the second alignment electrode RMT2 are formed may face the upper surface of the first substrate SUB of the target substrate 1000. For example, the first alignment electrode RMT1 and the second alignment electrode RMT2 formed on the first alignment mask 910 may face the upper surface of the via layer 165.

In the second alignment mask 920, one surface of the base substrate SUB on which the first alignment electrode RMT1 and the second alignment electrode RMT2 are formed may face the lower surface of the first substrate SUB1 of the target substrate 1000. For example, the first alignment electrode RMT1 and the second alignment electrode RMT2 formed on the second alignment mask 920 may face the lower surface of the via layer 165.

In the present embodiment, because the first alignment mask 910 and the second alignment mask 920 are over and under the target substrate 1000, respectively, a first electric field IEL1 may be formed from the upper portion of the target substrate 1000 by the first alignment mask 910, and a second electric field IEL2 may be formed from the lower portion of the target substrate 1000 by the second alignment mask 920. Accordingly, the dielectrophoretic force due to the first and second electric fields IEL1 and IEL2 may increase. Therefore, a greater dielectrophoretic force is applied to the light emitting element ED, so that the degree of alignment of the light emitting element ED may be improved.

Figure 13:
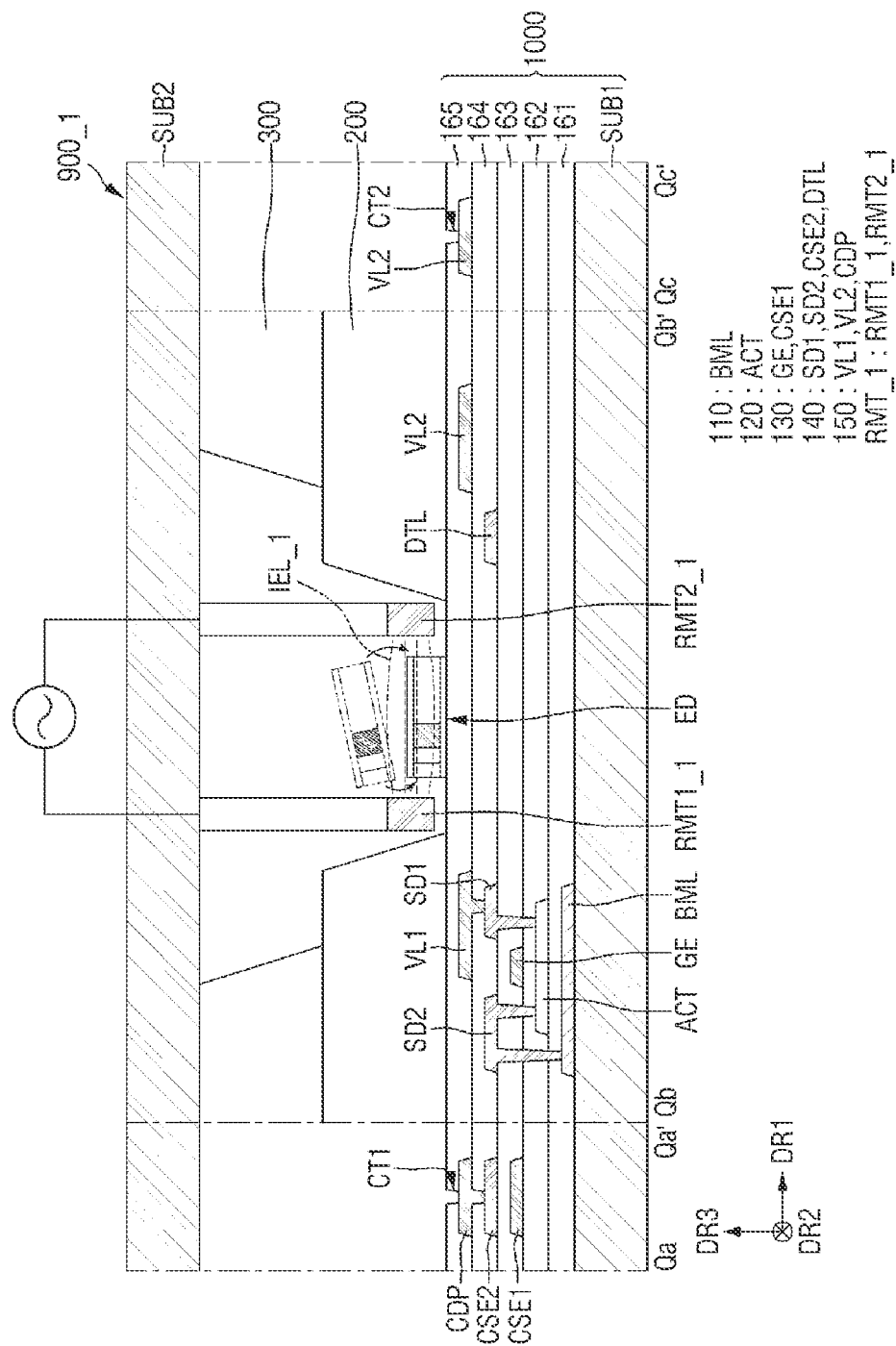
FIG. 13 is a cross-sectional view illustrating still another example of an alignment process of a light emitting element.

FIG. 13 is a cross-sectional view illustrating one or more other embodiments of an alignment process of a light emitting element.

Referring to FIG. 13, in an alignment mask 900_1 used in the process of aligning the light emitting element ED (e.g., a plurality of light emitting elements ED) according to the present embodiment, the shape of each of a first alignment electrode RMT1_1 and a second alignment electrode RMT2_1 included in the alignment mask 900_1 may be different from the shape of each of the first alignment electrode RMT1 and the second alignment electrode RMT2 included in the alignment mask 900 shown in FIG. 8.

In one or more embodiments, the length of each of the first alignment electrode RMT1_1 and the second alignment electrode RMT2_1 formed on one surface of the base substrate SUB2 of the alignment mask 900_1 according to the present embodiment in the third direction DR3 may be greater than the thickness of the second bank 300. Further, the distance of each of the first alignment electrode RMT1_1 and the second alignment electrode RMT2_1 in the first direction DR1 may be smaller than the distance between the first banks 200 in the one sub-pixel SPX. Therefore, when the alignment mask 900_1 is on the target substrate 1000, a part of the first alignment electrode RMT1_1 and a part of the second alignment electrode RMT2_1 may be in the space between the first banks 200 spaced apart from each other.

Because the length of each of the first and second alignment electrodes RMT1_1 and RMT2_1 in the third direction DR3 is greater than the thickness of the second bank 300, the first and second alignment electrodes RMT1_1 and RMT2_1 may be adjacent to the via layer 165 of the target substrate 1000. Accordingly, because the first and second alignment electrodes RMT1_1 and RMT2_1 are adjacent to the area where the light emitting element ED is to be positioned to form an electric field, the degree of alignment of the light emitting element ED may be improved.

Figure 14:
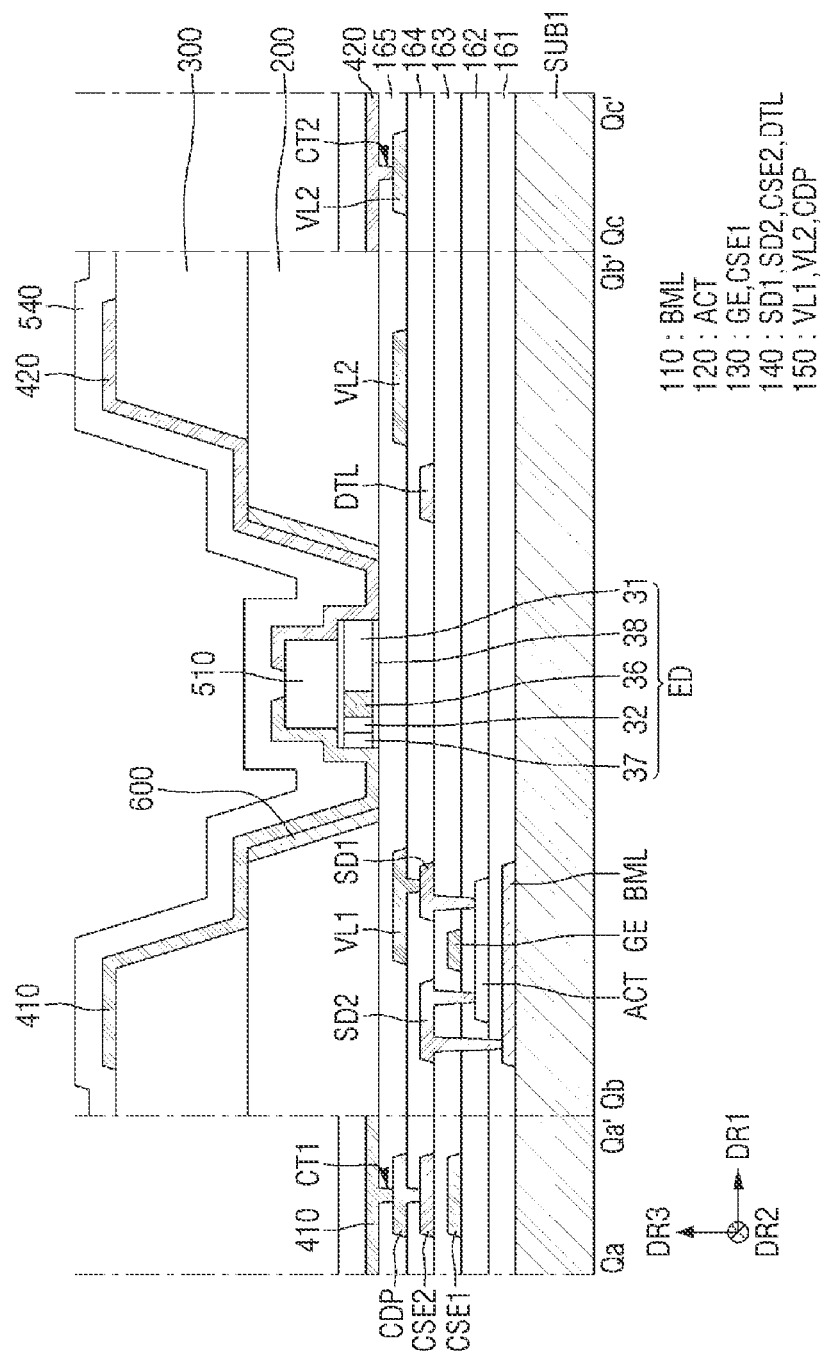
FIG. 14 is a cross-sectional view of a display device according to one or more embodiments.

FIG. 14 is a cross-sectional view of a display device according to one or more other embodiments.

Referring to FIG. 14, a display device 10 of the present embodiment is different from the display device 10 of the embodiment of FIG. 3 in that a reflective layer 600 is further formed on the side surface of the first bank 200.

Here, a reflective layer 600 is formed on the side surface of the first bank 200 facing both ends of the light emitting element ED. The reflective layer 600 may cover the entire side surfaces of the first banks 200. Although it is shown in FIG. 14 that the reflective layer 600 covers the side surface of the first bank 200, the present disclosure is not limited thereto. For example, the reflective layer 600 may also be on the side surface of the first bank 200 and a part of the upper surface of the first bank 200.

The reflective layer 600 may include a material having high reflectance. For example, the reflective layer 600 may include a material such as silver (Ag), copper (Cu), aluminum (Al), nickel (Ni), or an alloy thereof, ITO (Indium Tin Oxide), IZO (Indium Zinc Oxide), and/or ITZO (Indium Tin-Zinc Oxide), but the material thereof is not limited thereto. The reflective layer 600 may be directly deposited or applied on the side surface of the first bank 200.

A part of the light emitted from the light emitting element ED and traveling toward the side surface of the first bank 200 may be reflected by the reflective layer 600 and travel in the display direction of the display device 10, for example, in the third direction DR3. For example, the reflective layer 600 may serve to change the direction of the light emitted from the light emitting element ED and traveling toward the side surface of the first bank 200 to the display direction of the display device 10, for example, the third direction DR3.

In the case of the present embodiment, because the reflection is made by the reflective layer 600, the light emitted from the light emitting element ED travels in the display direction of the display device 10, so that the light emission efficiency of the display device 10 may be improved.

Figure 15:
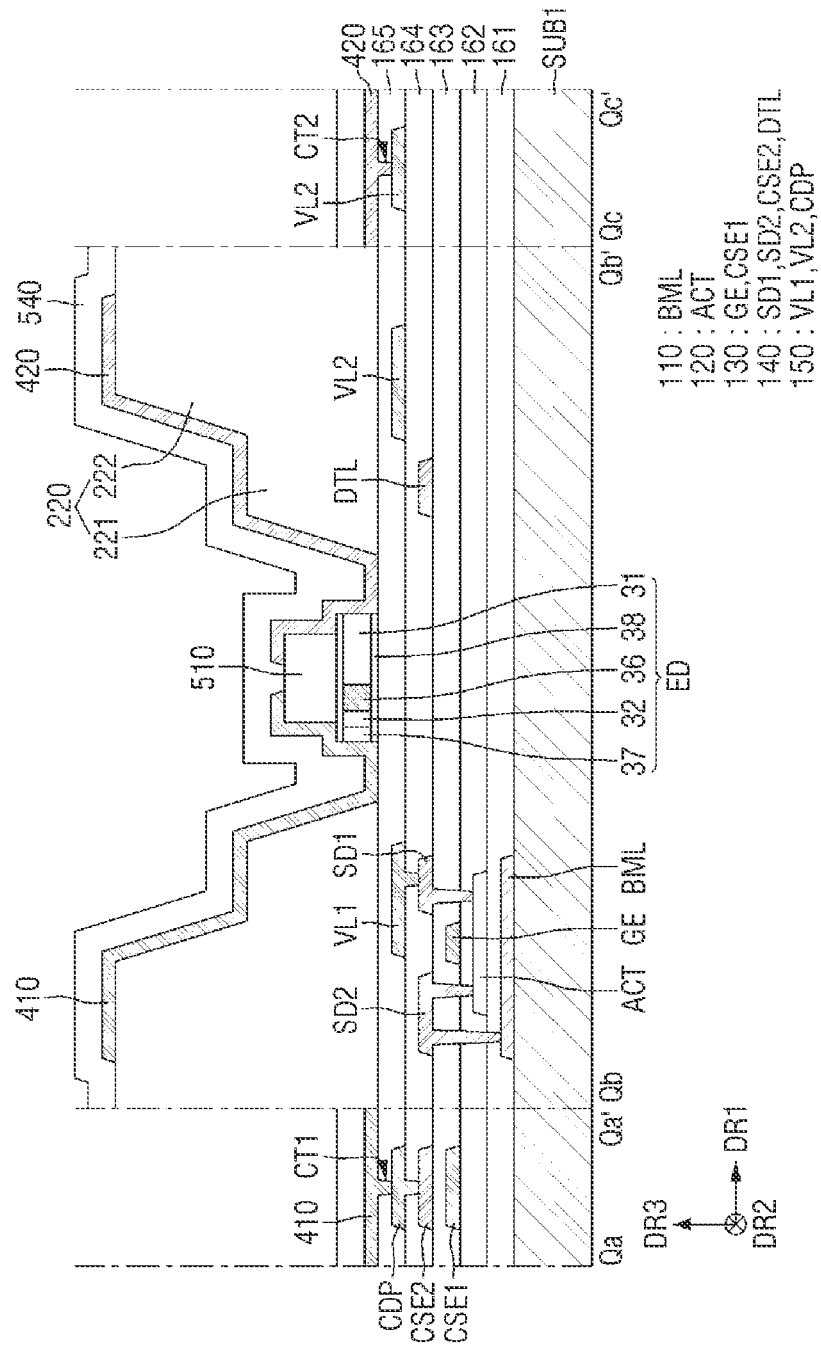
FIG. 15 is a cross-sectional view of a display device according to one or more embodiments.

FIG. 15 is a cross-sectional view of a display device according to one or more other embodiments.

Referring to FIG. 15, a display device 10 of the present embodiment is different from the display device 10 of the embodiment of FIG. 3 in that the display device 10 of the present embodiment includes a third bank 220 having a different height for each area corresponding to the first and second banks 200 and 300 of FIG. 3.

For example, the display device 10 of the present embodiment may include a third bank 220 on the via layer 165. The third bank 220 may include a step structure having a different height for each area. The third bank 220 may include a first region 221 having a first height and a second region 222 having a second height greater (higher) than the first height. The height of the third bank 220 may be measured from the same reference surface as one surface of the first substrate SUB1. Each region of the third bank 220 may have a substantially flat surface regardless of the shape or presence of a pattern below. The third bank 220 may have a step structure at the boundary of each region.

The first region 221 of the third bank 220 may be in an area adjacent to the light emitting element ED in the light emission area EMA. The first region 221 of the third bank 220 may play the same role as the above-described first bank 200 of FIG. 3. For example, the first region 221 of the third bank 220 may serve to provide a space in which the plurality of light emitting elements ED are positioned, and simultaneously (or concurrently), may serve as a reflective partition wall for changing the traveling direction of light emitted from the light emitting element ED to the display direction.

The second region 222 of the third bank 220 may be provided across the boundary of the respective sub-pixels SPX in the non-light emission area. The second region 222 of the third bank 220 may play the same role as the above-described second bank 300 of FIG. 3. For example, the second region 222 of the third bank 220 may perform a function of preventing or reducing the overflow of ink to the adjacent sub-pixel SPX in the inkjet printing process of the process of manufacturing the display device 10.

The third bank 220 may include an organic material including a photosensitive material. For example, the third bank 220 may include an organic insulating material such as polyimide (PI), but the material thereof is not limited thereto. In this case, the third bank 220 may be formed through exposure and development after applying the organic material layer for the third bank 220. The third bank 220 having different heights for each region (e.g., for each step) may be formed using a multitone mask or a slit mask.

The first contact electrode 410 and the second contact electrode 420 may be on the third bank 220. The first contact electrode 410 and the second contact electrode 420 may cover the entire first region 221 of the third bank 220, and may be formed on a part of the second region 222 of the third bank 220.

When the first region 221 and the second region 222 of the third bank 220 corresponding to the first bank 200 and the second bank 300, respectively, are formed into the third bank 220 having different heights for each region using a multi-tone mask or a slit mask by one process, a separate process for forming the first and second banks 200 and 300 is not required, so that the process efficiency of the display device 10 may be improved.

Figure 16:
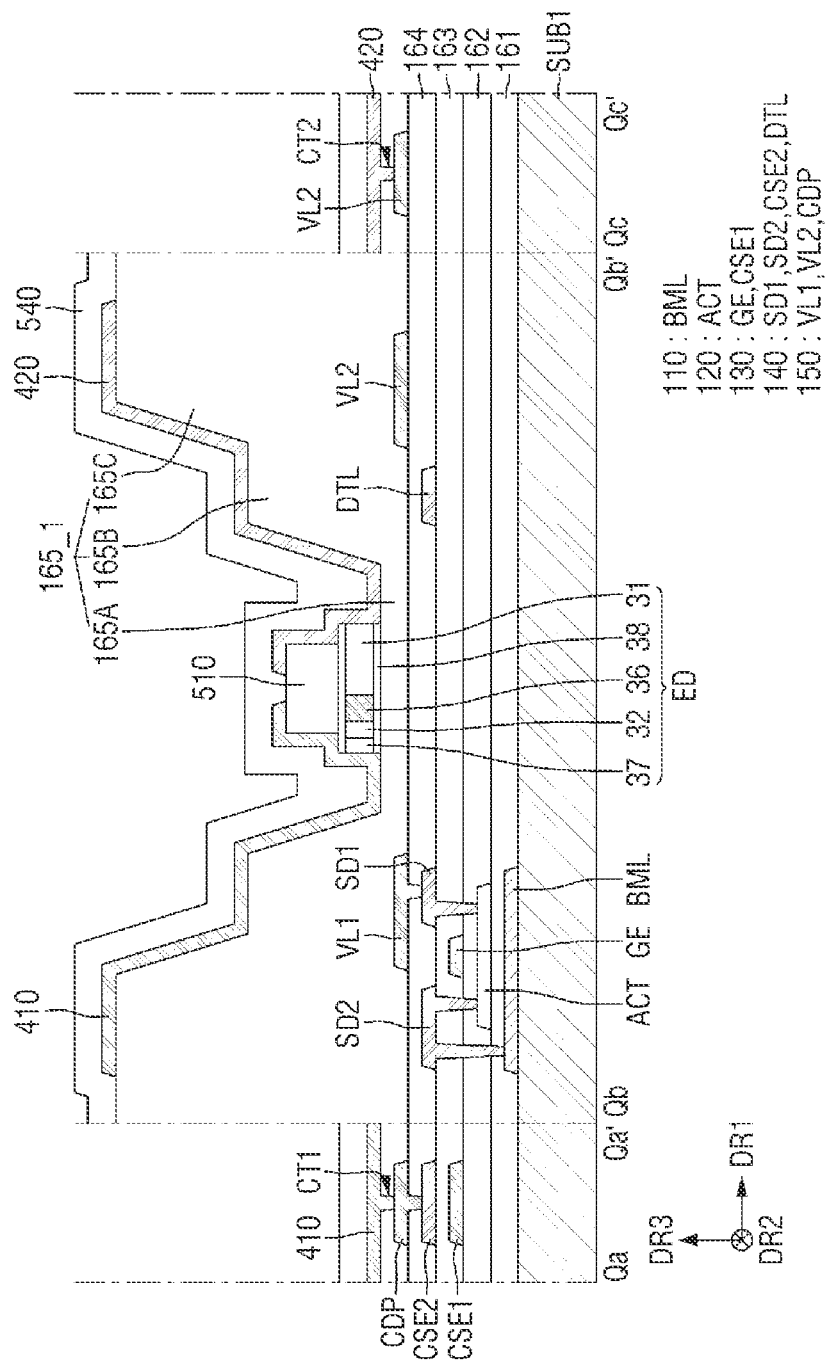
FIG. 16 is a cross-sectional view of a display device according to one or more embodiments.

FIG. 16 is a cross-sectional view of a display device according to one or more other embodiments.

Referring to FIG. 16, a display device 10 of the present embodiment is different from the display device 10 of the embodiment of FIG. 3 in that the display device 10 of the present embodiment includes a via layer 165_1 having different heights for each region corresponding to the via layer 165 and first and second banks 200 and 300 of FIG. 3.

For example, the via layer 165_1 according to the present embodiment may include a step structure having different thicknesses (e.g., heights) for each region. The via layer 165_1 may include a first step section 165A having a first thickness (e.g., height), a second step section 165B having a second thickness (e.g., height) greater than the first thickness, and a third step section 165C having a third thickness (e.g., height) higher (greater) than the second thickness.

The first step section 165A, second step section 165B, and third step section 165C of the via layer 165_1 may be substantially the same as the via layer 165, the first bank 200, and the second bank 300, having been described above with reference to FIG. 3, respectively.

In the case of the present embodiment, the regions respectively corresponding to the via layer 165, the first bank 200, and the second bank 300 of FIG. 3 are formed into the via layer 165_1 having a step structure by one process, so that the process efficiency of the display device 10 may be improved.

Figure 17:
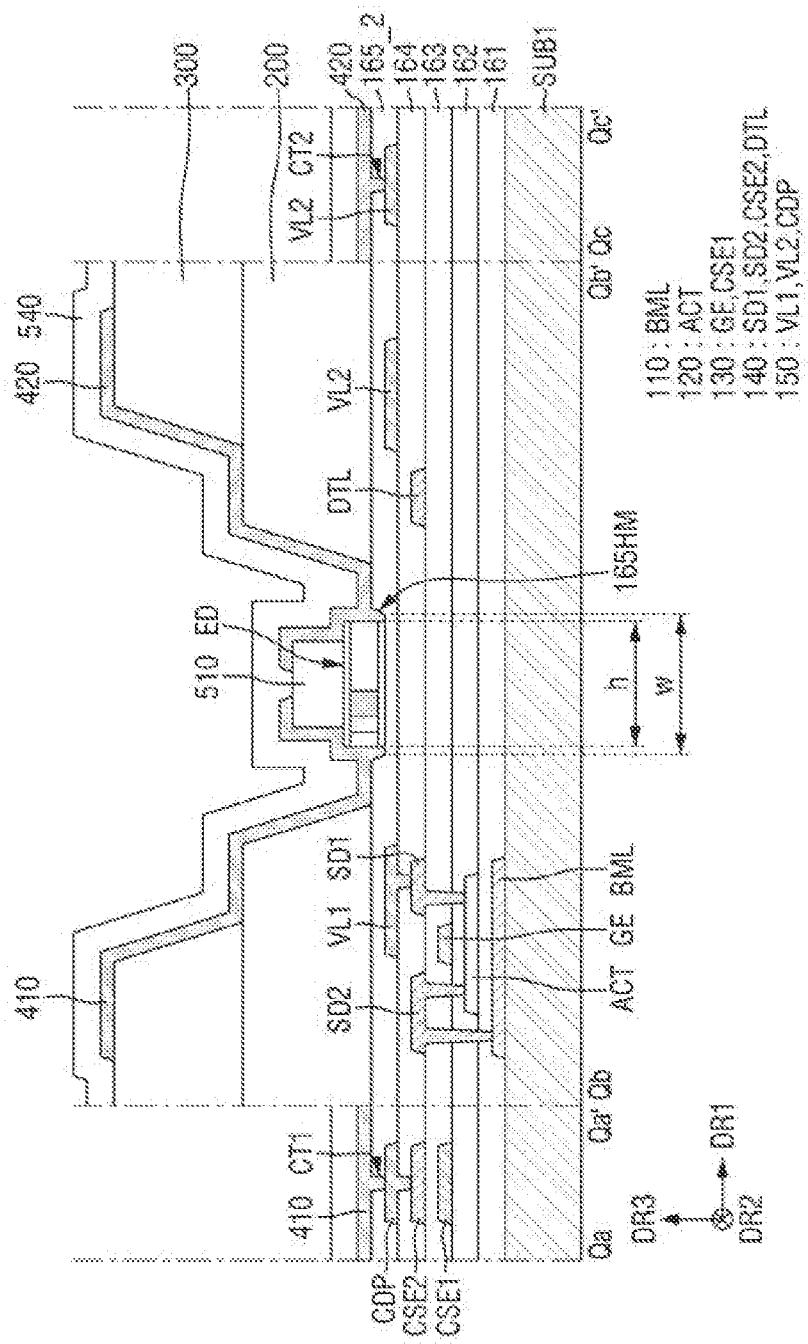
FIG. 17 is a cross-sectional view of a display device according to one or more embodiments.

FIG. 17 is a cross-sectional view of a display device according to one or more other embodiments.

Referring to FIG. 17, the present embodiment is different from the display device 10 of the embodiment of FIG. 3 in that a via layer 165_2 has a groove 165HM.

For example, the via layer 165_2 according to the present embodiment may have a groove 165HM recessed from the upper surface of the via layer 165_2 in a thickness direction of the via layer 165_2, for example, in a direction opposite to the third direction DR3. In one or more embodiments, the cross-sectional shape of the groove 165HM may be a trapezoidal shape whose width increases as it progresses in the third direction DR3. However, the present disclosure is not limited thereto.

In one or more embodiments, the groove 165HM formed in the upper surface of the via layer 165_2 may have a shape extending along the second direction DR2 within one sub-pixel SPX. However, the present disclosure is not limited thereto, a plurality of grooves 165HM spaced apart from each other along the second direction DR2 may be formed in the upper surface of the via layer 165_2. The groove 165HM may be formed between the first banks 200 spaced apart from each other in one sub-pixel SPX.

The light emitting element ED may be in the groove 165HM of the via layer 165_2. The depth of the groove 165HM of the via layer 165_2 may be smaller than the diameter of the light emitting element ED. Accordingly, the light emitting element ED positioned in the groove 165HM may protrude from the via layer 165_2 in the third direction DR3. The groove 165HM of the via layer 165_2 may be formed between the first banks 200 such that the upper surface of the via layer 165_2 is recessed, thereby providing a space in which the light emitting element ED is positioned. For example, the groove 165HM of the via layer 165_2 may serve to guide a region where the light emitting element ED should be placed in the process of aligning the light emitting element ED.

The width W of the groove 165HM in the first direction DR1 may be greater than the length h of the light emitting element ED in the extending direction thereof. In one or more embodiments in which the width of the cross-sectional shape of the groove 165HM is changed as it proceeds in the third direction DR3, the minimum (e.g., smallest) width W of the groove 165HM in the first direction DR1 may be greater than the length h of the light emitting element ED in the extending direction thereof. Because the width W of the groove 165HM in the first direction DR1 is greater than the length h of the light emitting element ED in the extending direction thereof, it may be easy for the light emitting element ED to be placed and aligned in the groove 165HM of the via layer 165_2.

In the case of the present embodiment, the groove 165HM, in which a part of the upper surface of the via layer 165_2 exposed by the first bank 200 is recessed, is formed in a space between the first banks 200, and thus it may be easy for the light emitting element ED to be placed in the groove 165HM in the process of aligning the light emitting element ED. The groove 165HM may guide the light emitting element ED to be placed between the first banks 200 in the process of aligning the light emitting element ED during the process of manufacturing the display device 10. Accordingly, the groove 165HM in which a part of the upper surface of the via layer 165_2 is depressed may be designed and formed in a region in which the light emitting element ED is to be placed and aligned, thereby improving the degree of alignment of the light emitting element ED.

Figure 18:
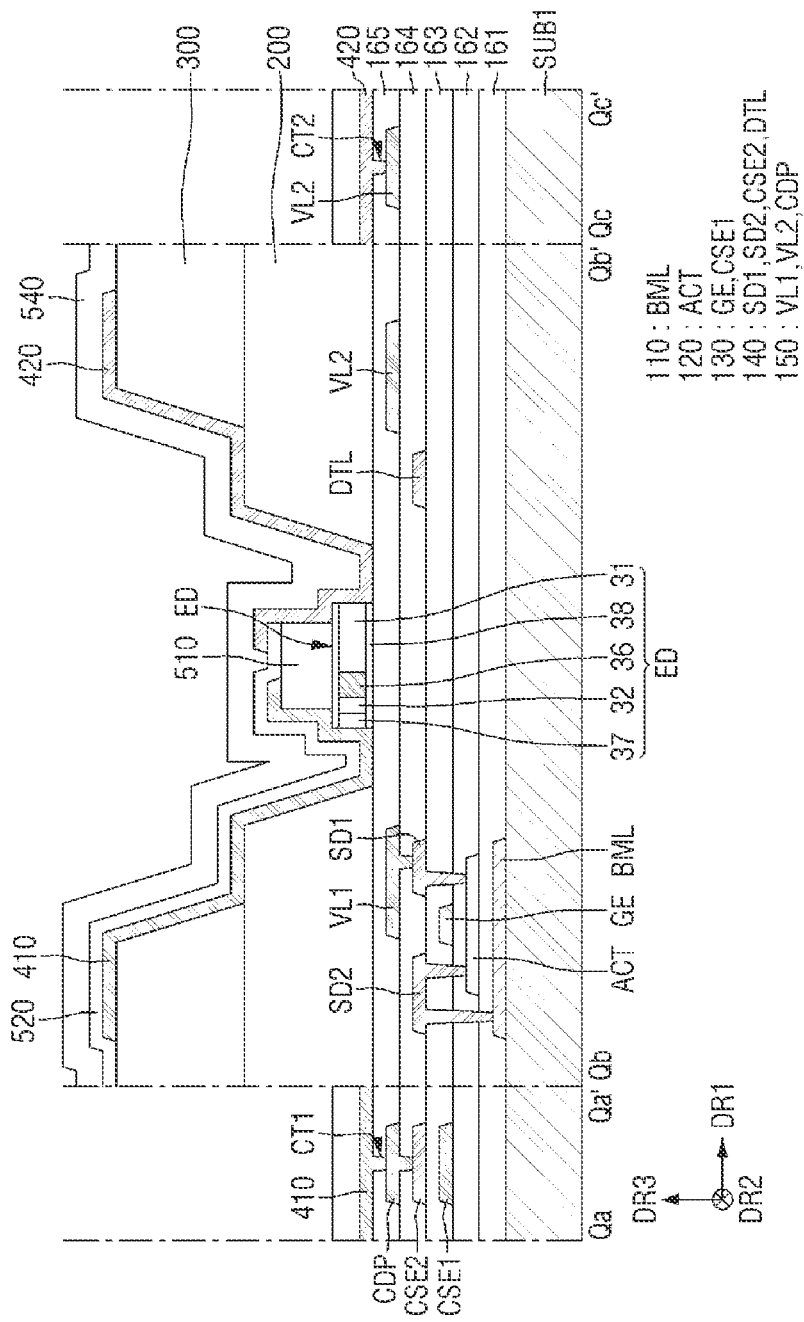
FIG. 18 is a cross-sectional view of a display device according to one or more embodiments.

FIG. 18 is a cross-sectional view of a display device according to one or more other embodiments.

Referring to FIG. 18, a display device 10 of the present embodiment is different from the display device 10 of the embodiment of FIG. 3 in that the display device 10 of the present embodiment further include a third insulating layer 520 on the first contact electrode 410, and the second contact electrode 420 is on the third insulating layer 520.

For example, a third insulating layer 520 may be on the first contact electrode 410. The third insulating layer 520 may be on the first contact electrode 410 to completely cover the first contact electrode 410. The third insulating layer 520 may also be partially on the upper surface of the first insulating layer 510 exposed by the first contact electrode 410. The third insulating layer 520 may be on the first insulating layer 510, and may expose the other end of the light emitting element ED such that the second contact electrode 420 contacts the other end of the light emitting element ED.

The second contact electrode 420 may be on the third insulating layer 520. The second contact electrode 420 may be partially on the third insulating layer 520 that is positioned on the first insulating layer 510.

The present embodiment is different from the embodiment of FIG. 3 in that the first contact electrode 410 and the second contact electrode 420 are not formed on the same layer, and the third insulating layer 520 is interposed between the first contact electrode 410 and the second contact electrode 420 to insulate them from each other. Therefore, duplicative descriptions of the same features as those described in connection with FIG. 3 will not be provided.

Figure 19:
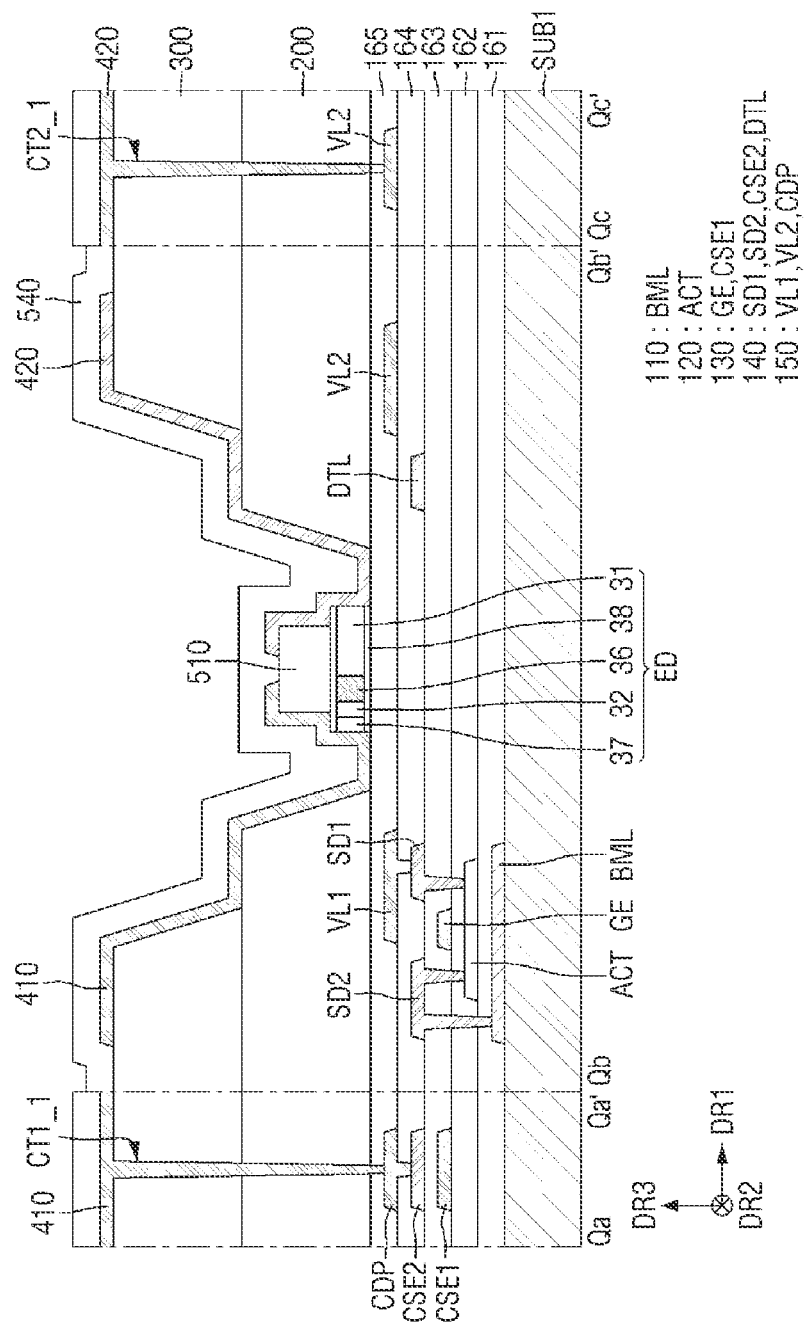
FIG. 19 is a cross-sectional view of a display device according to one or more embodiments.

FIG. 19 is a cross-sectional view of a display device according to one or more other embodiments.

Referring to FIG. 19, the present embodiment is different from the embodiment of FIG. 3 in that a first contact hole CT1_1 and a second contact hole CT2_1 are provided to overlap the first and second banks 200 and 300 in the third direction DR3.

For example, the first and second contact holes CT1_1 and CT2_1 according to the present embodiment may overlap the first and second banks 200 and 300 in the third direction DR3. Accordingly, the first and second contact holes CT1_1 and CT2_1 may be formed to penetrate the first bank 200, the second bank 300, and the via layer 165. In this case, the first and second contact electrodes 410 and 420 may be on the second bank 300, and may be in contact with the first conductive pattern CDP and the first voltage line VL2, respectively, through the first and second contact holes CT1_1 and CT2_1 penetrating the first bank 200, the second bank 300, and the via layer 165.

Figure 20:
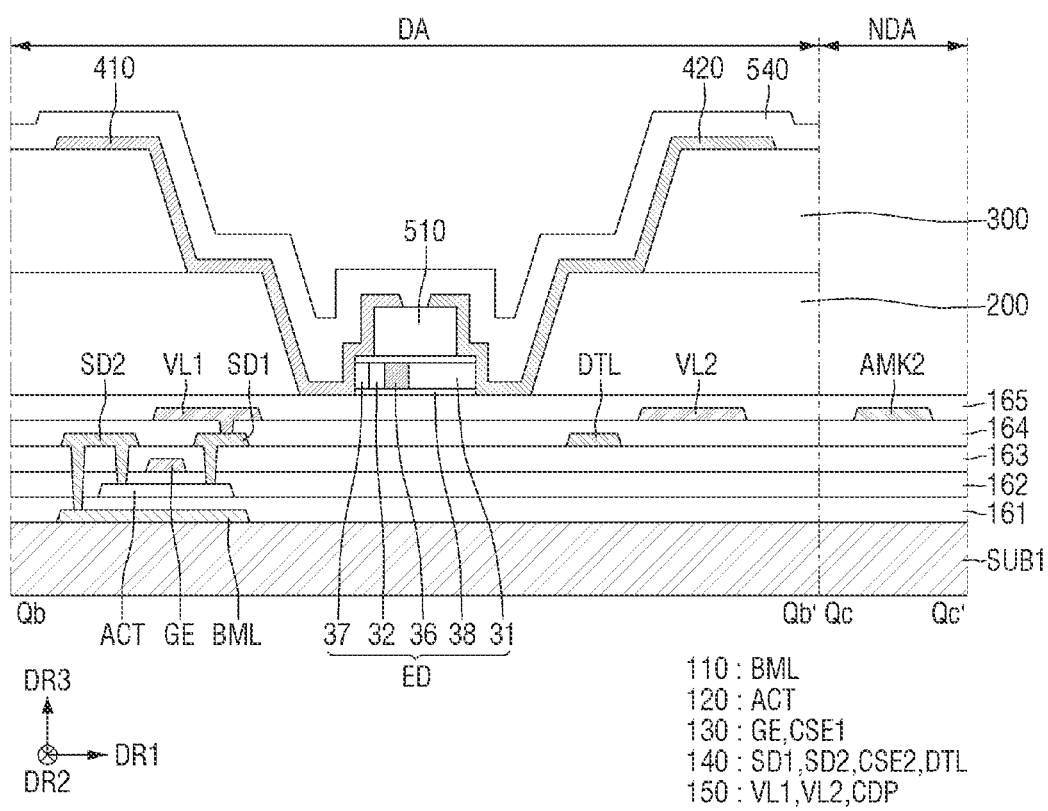
FIG. 20 is a cross-sectional view of a display device according to one or more embodiments.

FIG. 20 is a cross-sectional view of a display device according to one or more other embodiments.

Referring to FIG. 20, a display device 10 of the present embodiment is different from the display device 10 of the embodiment of FIG. 3 in that the display device 10 of the present embodiment includes a second alignment mark AMK2 in the non-display area NDA.

For example, the display device 10 according to the present embodiment may include a second alignment mark AMK2 in the non-display area NDA. The second alignment mark AMK2 may be formed as one of the plurality of conductive layers of the circuit element layer. In one or more embodiments, the second alignment mark AMK2 may be included in the second data conductive layer 150, and may be formed on the same layer as the above-described first and second voltage lines VL2 and VL1. However, the present disclosure is not limited thereto, and the second alignment mark AMK2 may be formed to be included in the first data conductive layer 140 or the gate conductive layer 130.

The second alignment mark AMK2 may serve to align the alignment mask 900 and the first substrate SUB1 using the alignment mask 900 in the process of aligning the light emitting element ED. In one or more embodiments, after aligning the second alignment mark AMK2 of the display device 10 and the first alignment mark AMK1 of the alignment mask 900 to overlap each other in the third direction DR3, the light emitting element ED may be aligned using the alignment mask 900.

In concluding the detailed description, those skilled in the art will appreciate that many variations and modifications can be made to the embodiments described herein without substantially departing from the principles of the present disclosure as set forth in the following claims and their equivalents. Therefore, the disclosed embodiments of the present disclosure are used in a generic and descriptive sense only and not for purposes of limitation.

What is claimed is:

1. A display device, comprising:
  a substrate;
  a data conductive layer on the substrate and comprising a first voltage line;
  a via layer on the data conductive layer;
  a light emitting element on the via layer;
  a first contact electrode on the light emitting element and contacting a first end of the light emitting element; and
  a second contact electrode on the light emitting element and contacting a second end of the light emitting element, wherein the second contact electrode is electrically coupled to the first voltage line through a first contact hole penetrating the via layer, and
wherein the second contact electrode is in direct physical contact with the first voltage line.

2. The display device of claim 1, further comprising:
a transistor between the substrate and the data conductive layer,
wherein the first contact electrode is electrically coupled to the transistor.

3. A display device, comprising:
a substrate;
a data conductive layer on the substrate and comprising a first voltage line;
a via layer on the data conductive layer;
a light emitting element on the via layer;
a first contact electrode on the light emitting element and contacting a first end of the light emitting element;
a second contact electrode on the light emitting element and contacting a second end of the light emitting element, and
a transistor between the substrate and the data conductive layer,
wherein the second contact electrode is electrically coupled to the first voltage line through a first contact hole penetrating the via layer,
wherein the first contact electrode is electrically coupled to the transistor,
wherein the data conductive layer further comprises a first conductive pattern electrically coupled to a first electrode of the transistor, and
wherein the first contact electrode is electrically coupled to the first conductive pattern through a second contact hole penetrating the via layer.

4. The display device of claim 3,
wherein the first contact electrode is in direct contact with the first conductive pattern.

5. The display device of claim 1,
wherein the light emitting element is on one surface of the via layer.

6. The display device of claim 5,
wherein the first contact electrode and the second contact electrode are on one surface of the via layer exposed by the light emitting element.

7. The display device of claim 1, further comprising:
a first insulating layer on the light emitting element,
wherein the first contact electrode and the second contact electrode are on the first insulating layer.

8. The display device of claim 1,
wherein the data conductive layer comprises an alignment mark.

9. A display device, comprising:
a substrate;
a data conductive layer on the substrate and comprising a first voltage line;
a via layer on the data conductive layer;
a light emitting element on the via layer;
a first contact electrode on the light emitting element and contacting a first end of the light emitting element;
a second contact electrode on the light emitting element and contacting a second end of the light emitting element, and
a bank on the via layer,
wherein the second contact electrode is electrically coupled to the first voltage line through a first contact hole penetrating the via layer, and
wherein the bank does not overlap the light emitting element in a thickness direction of the substrate, and the first contact electrode and the second contact electrode are on the bank.

10. The display device of claim 9,
wherein the first contact electrode and the second contact electrode are directly on a side surface of the bank.

11. A display device, comprising:
a substrate;
a data conductive layer on the substrate and comprising a first voltage line;
a via layer on the data conductive layer;
a light emitting element on the via layer;
a first contact electrode on the light emitting element and contacting a first end of the light emitting element; and
a second contact electrode on the light emitting element and contacting a second end of the light emitting element,
wherein the second contact electrode is electrically coupled to the first voltage line through a first contact hole penetrating the via layer, and
wherein the via layer comprises a first region having a first thickness and a second region having a second thickness greater than the first thickness, and the light emitting element is on the first region of the via layer.

12. The display device of claim 11,
wherein the second region of the via layer does not overlap the light emitting element in a thickness direction of the substrate, and a side surface of the second region of the via layer and one end selected from the first end and the second end of the light emitting element face each other.

13. The display device of claim 12,
wherein the first contact electrode and the second contact electrode are on the second region of the via layer exposed by the light emitting element.

14. The display device of claim 1,
wherein one surface of the via layer comprises a groove in which the one surface of the via layer is recessed in a thickness direction of the via layer.

15. The display device of claim 14,
wherein the light emitting element is in the groove.

* * * * *